(12) United States Patent
Hwang et al.

(10) Patent No.: US 11,244,736 B2
(45) Date of Patent: Feb. 8, 2022

(54) MEMORY DEVICE AND METHOD OF OPERATING THE SAME

(71) Applicant: SK hynix Inc., Gyeonggi-do (KR)

(72) Inventors: Sung Hyun Hwang, Gyeonggi-do (KR); Kyu Sub Yoon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/989,134

(22) Filed: Aug. 10, 2020

(65) Prior Publication Data

US 2021/0257038 A1 Aug. 19, 2021

(30) Foreign Application Priority Data

Feb. 19, 2020 (KR) .......................... 10-2020-0020558

(51) Int. Cl.
*G11C 11/34* (2006.01)
*G11C 16/34* (2006.01)
*G11C 16/10* (2006.01)
*G11C 16/26* (2006.01)
*G11C 16/30* (2006.01)

(52) U.S. Cl.
CPC .......... *G11C 16/3481* (2013.01); *G11C 16/10* (2013.01); *G11C 16/26* (2013.01); *G11C 16/30* (2013.01); *G11C 16/3404* (2013.01)

(58) Field of Classification Search
CPC ..... G11C 16/10; G11C 11/5628; G11C 16/12; G11C 16/0483; G11C 16/3454

USPC ......................................... 365/185.19, 185.22
See application file for complete search history.

(56) References Cited

U.S. PATENT DOCUMENTS

| 7,596,028 B2 * | 9/2009 | Chen ...................... G11C 16/10 365/185.02 |
| 2014/0025866 A1 * | 1/2014 | Kim ....................... G11C 16/10 711/103 |
| 2019/0272878 A1 * | 9/2019 | Lee ......................... G11C 16/10 |

FOREIGN PATENT DOCUMENTS

| KR | 10-2017-0085776 | 7/2017 |
| KR | 10-2018-0081956 | 7/2018 |
| KR | 10-2019-0064965 | 6/2019 |

* cited by examiner

*Primary Examiner* — Son T Dinh
(74) *Attorney, Agent, or Firm* — IP & T Group LLP

(57) ABSTRACT

Provided herein is a memory device and a method of operating the memory device. The memory device may include a plurality of memory cells; a peripheral circuit configured to verify a program operation on the plurality of memory cells using a first verify voltage; and a control logic configured to control the peripheral circuit to suspend the program operation in response to a suspend command and verify the program operation on the plurality of memory cells using a second verify voltage in response to a resume command input after the suspend command. The second verify voltage may have a lower voltage level than the first verify voltage.

20 Claims, 19 Drawing Sheets

MEMORY DEVICE AND METHOD OF OPERATING THE SAME

CROSS-REFERENCE TO RELATED APPLICATION

The present application claims priority under 35 U.S.C. § 119(a) to Korean patent application number 10-2020-0020558, filed on Feb. 19, 2020, which is incorporated herein by reference in its entirety.

BACKGROUND

1. Field of Invention

Various embodiments of the present invention disclosure generally relate to an electronic device and, more particularly, to a memory device and a method of operating the memory device.

2. Description of Related Art

Generally, a storage device stores data under the control of a host device such as, for example, a computer or a smartphone. The storage device may include a memory device configured to store data, and a memory controller configured to control the memory device. Memory devices are chiefly classified into volatile and nonvolatile memory devices.

A volatile memory device stores data only when power is supplied thereto, and loses the stored data when power is turned off. Examples of a volatile memory device include a static random-access memory (SRAM), and a dynamic random-access memory (DRAM).

A nonvolatile memory device maintains stored data even when power to the device is turned off. Examples of a nonvolatile memory device include a read-only memory (ROM), a programmable ROM (PROM), an electrically programmable ROM (EPROM), an electrically erasable programmable ROM (EEPROM), and a flash memory.

SUMMARY

Various embodiments of the present invention disclosure are directed to a memory device exhibiting improved program performance including forming improved threshold voltage distributions, and to a method of operating the memory device.

An embodiment of the present invention disclosure provides a memory device including: a plurality of memory cells; a peripheral circuit configured to verify a program operation on the plurality of memory cells using a first verify voltage; and a control logic configured to control the peripheral circuit to suspend the program operation in response to a suspend command and verify the program operation on the plurality of memory cells using a second verify voltage in response to a resume command input after the suspend command. The second verify voltage may have a lower voltage level than the first verify voltage.

An embodiment of the present invention disclosure provides a memory device including: a memory cell array including a plurality of memory cells; a peripheral circuit configured to perform a program operation on the plurality of memory cells; and a control logic configured to suspend the program operation in response to a suspend command and change, in response to a resume command input after the suspend command, at least one operating voltage to be used in the program operation depending on an amount by which threshold voltages of the plurality of memory cells are changed while the program operation is suspended.

An embodiment of the present invention disclosure provides a method of operating a memory device including a plurality of memory cells. The method may include: suspending a program operation on the plurality of memory cells in response to a suspend command; changing a voltage level of a verify voltage to be used in an operation of verifying the program operation based on shift information indicating a degree by which threshold voltages of the plurality of memory cells are shifted while the program operation is suspended; and resuming the program operation using a verify voltage having a changed voltage level in response to a resume command.

An embodiment of the present invention disclosure provides a memory device including: a storage unit, a first memory for storing information indicating a first set of one or more initial verify voltages, a second memory for storing information indicating second sets respectively corresponding to degrees of suspension, each set representing one or more verify voltages, and an operational circuit suitable for detecting one or more programmed states of failed verification in a program loop suspended due to a suspension command for an ongoing program operation on the storage unit, detecting the degree of suspension caused between time points of the suspension command and a resumption command for the suspended program operation, and resuming the suspended program operation with the verify voltages for the programmed states of failed verification within the second set corresponding to the detected degree and the verify voltages for remaining programmed states within the first set.

These and other features and advantages of the present invention may become better understood by the following detailed description and drawings.

DETAILED DESCRIPTION

Figure 1:
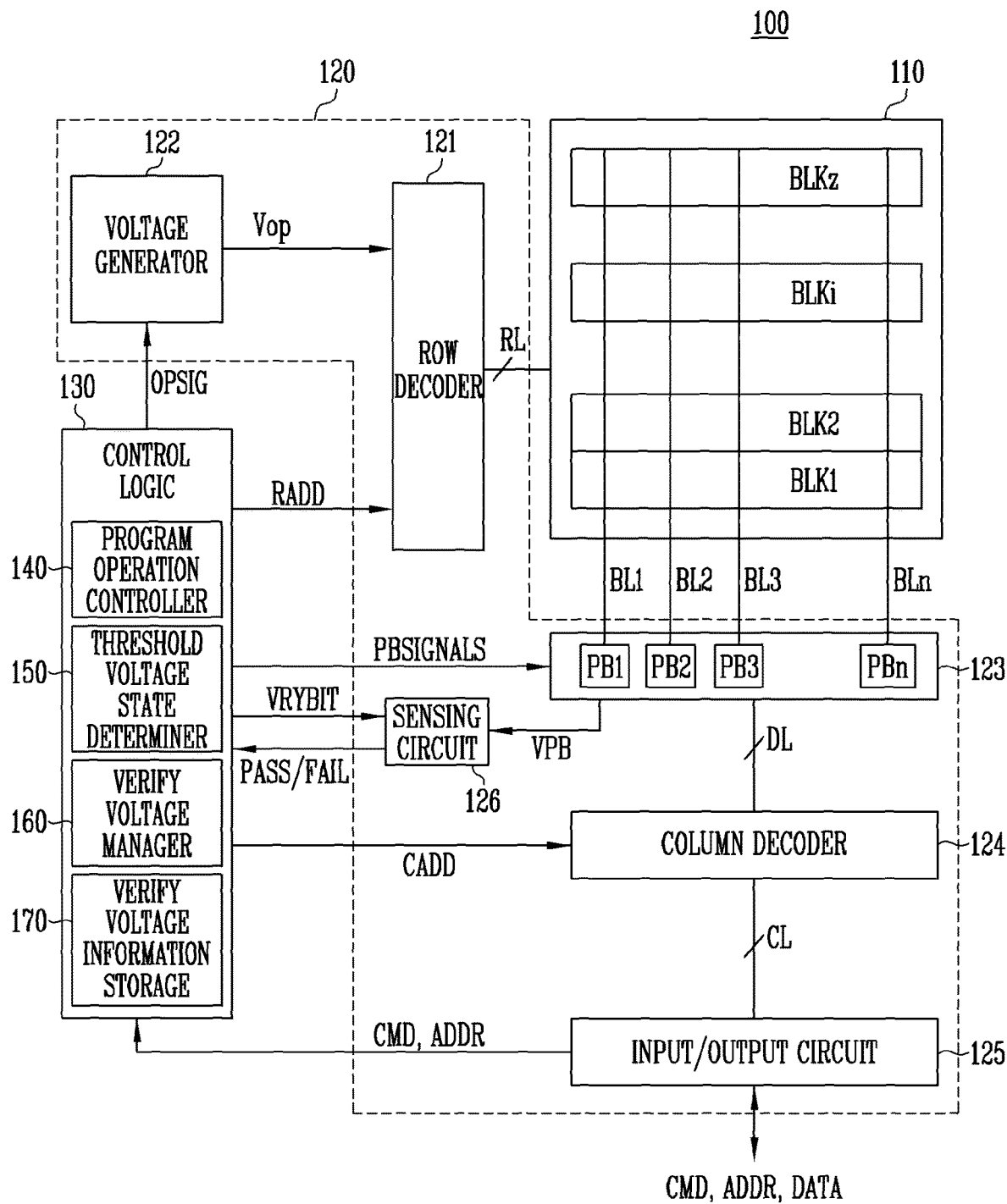
FIG. 1 is a diagram illustrating a memory device in accordance with an embodiment of the present invention disclosure.

FIG. 1 is a diagram illustrating a memory device 100 in accordance with an embodiment of the present invention disclosure.

Referring to FIG. 1, the memory device 100 may include a memory cell array 110, a peripheral circuit 120, and a control logic 130.

The memory cell array 110 may include a plurality of memory blocks BLK1 to BLKz. The plurality of memory blocks BLK1 to BLKz are coupled to a row decoder 121 through row lines RL. The plurality of memory blocks BLK1 to BLKz may be coupled to a page buffer group 123 through bit lines BL1 to BLn. Each of the memory blocks BLK1 to BLKz may include a plurality of memory cells. In an embodiment, the plurality of memory cells may be nonvolatile memory cells. Memory cells coupled to each word line may be defined as a physical page. Hence, each memory block may include a plurality of physical pages.

The row lines RL may include at least one source select line SSL, a plurality of word lines, and at least one drain select line DSL.

Each of the memory cells included in the memory cell array 110 may be formed to store one more data bits. For example, each of the memory cells included in the memory cell array 110 may be formed of a single-level cell (SLC) capable of storing a single data bit, a multi-level cell (MLC) capable of storing two data bits, a triple-level cell (TLC) capable of storing three data bits, or a quad-level cell (QLC) capable of storing four data bits.

The peripheral circuit 120 may perform any suitable operation including, but not limited to, a program operation, a read operation, or an erase operation on an area of the memory cell array 110 under control of the control logic 130. The area may be a selected area of the memory cell array 110. The selection of the memory area may be random. The peripheral circuit 120 may drive the memory cell array 110. For example, the peripheral circuit 120 may apply various operating voltages to the row lines RL and the bit lines BL1 to BLn, or discharge the applied voltages, as may be needed, under the control of the control logic 130.

The peripheral circuit 120 may include the row decoder 121, a voltage generator 122, the page buffer group 123, a column decoder 124, and an input/output circuit 125.

The row decoder 121 is coupled to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 may operate under control of the control logic 130. The row decoder 121 may receive a row address RADD from the control logic 130.

The row decoder 121 may decode the row address RADD. The row decoder 121 may select at least one memory block of the memory blocks BLK1 to BLKz in response to the decoded address. The row decoder 121 may select at least one word line WL of the selected memory block in response to the decoded address so that voltages generated from the voltage generator 122 are applied to the at least one word line WL.

For example, during a program operation, the row decoder 121 may apply a program voltage to a selected word line and apply a program pass voltage having a level lower than that of the program voltage to unselected word lines. During a program verify operation, the row decoder 121 may apply a verify voltage to a selected word line and apply a verify pass voltage higher than the verify voltage to unselected word lines. During a read operation, the row decoder 121 may apply a read voltage to a selected word line and apply a read pass voltage higher than the read voltage to unselected word lines.

In an embodiment, the erase operation of the memory cell array 110 may be performed on a memory block basis. During an erase operation, the row decoder 121 may select one memory block in response to a decoded address. During the erase operation, the row decoder 121 may apply a ground voltage to word lines coupled to the selected memory block.

The voltage generator 122 may operate under control of the control logic 130. The voltage generator 122 may generate a plurality of voltages using an external supply voltage supplied to the memory device 100. For example, the voltage generator 122 may generate various operating voltages Vop to be used for a program operation, a read operation, and an erase operation in response to an operating signal OPSIG. For example, the voltage generator 122 may generate a program voltage, a verify voltage, a pass voltage, a read voltage, an erase voltage, and so forth under control of the control logic 130.

In an embodiment, the voltage generator 122 may generate an internal supply voltage by regulating the external supply voltage. The internal supply voltage generated by the voltage generator 122 is used as an operating voltage for the memory cell array 110.

In an embodiment, the voltage generator 122 may generate a plurality of voltages using an external power supply voltage or an internal power supply voltage.

For example, the voltage generator 122 may include a plurality of pumping capacitors for receiving the internal supply voltage and generate a plurality of voltages by selectively activating the plurality of pumping capacitors under control of the control logic 130.

The generated voltages may be supplied to the memory cell array 110 by the row decoder 121.

The page buffer group 123 may include first to n-th page buffers PB1 to PBn. The first to n-th page buffers PB1 to PBn are coupled to the memory cell array 110 through the first to n-th bit lines BL1 to BLn, respectively. The first to n-th page buffers PB1 to PBn may operate under control of the control logic 130. For example, the first to n-th page buffers PB1 to PBn may operate in response to page buffer control signals PBSIGNALS. For instance, the first to n-th page buffers PB1 to PBn may temporarily store data received through the first to n-th bit lines BL1 to BLn, or sense voltages or currents of the first to n-th bit lines BL1 to BLn during a read operation or a verify operation.

For example, during a program operation, the first to n-th page buffers PB1 to PBn may transmit data DATA received through the input/output circuit 125 to selected memory cells through the first to n-th bit lines BL1 to BLn when a program pulse is applied to a selected word line. The memory cells in the selected page are programmed based on the transmitted data DATA. A memory cell coupled to a bit line to which a program enable voltage (e.g. a ground voltage) is applied may have an increased threshold voltage. The threshold voltage of a memory cell coupled to a bit line to which a program inhibit voltage (for example, a supply voltage) is applied may be retained. During a verify operation, the first to n-th page buffers PB1 to PBn may read page data from selected memory cells through the first to n-th bit lines BL1 to BLn.

During a read operation, the first to n-th page buffers PB1 to PBn may read data DATA from memory cells of a selected page through the first to n-th bit lines BL1 to BLn, and output the read data DATA to the input/output circuit 125 under control of the column decoder 124.

During an erase operation, the first to n-th page buffers PB1 to PBn may float the first to n-th bit lines BL1 to BLn.

The column decoder 124 may transmit data between the input/output circuit 125 and the page buffer group 123 in response to a column address CADD. For example, the column decoder 124 may exchange data with the first to n-th page buffers PB1 to PBn through data lines DL or exchange data with the input/output circuit 125 through column lines CL.

The input/output circuit 125 may transmit a command CMD or an address ADDR received from the memory controller (not illustrated) to the control logic 130, or exchange data with the column decoder 124.

During a read operation or a verify operation, the sensing circuit 126 may generate a reference current in response to an enable bit signal VRYBIT, and may compare a sensing voltage VPB received from the page buffer group 123 with a reference voltage generated by the reference current and output a pass signal PASS or a fail signal FAIL.

The control logic 130 may output an operating signal OPSIG, a row address RADD, page buffer control signals PBSIGNALS, and an enable bit signal VRYBIT in response to a command CMD and an address ADD, and thus control the peripheral circuit 120. In addition, the control logic 130 may determine whether a target memory cell has passed a verification during a verify operation in response to a pass signal PASS or a fail signal FAIL.

The control logic 130 in accordance with an embodiment may include a program operation controller 140, a threshold voltage state determiner 150, a verify voltage manager 160, and a verify voltage information storage 170.

The program operation controller 140 may control the peripheral circuit 120 to perform a write operation and a verify operation.

The program operation controller 140 may control the peripheral circuit 120 to perform a write operation of programming data on selected memory cells. For example, the program operation controller 140 may control the peripheral circuit 120 to apply a program voltage to a selected word line and apply a pass voltage to unselected word lines.

The program operation controller 140 may control the peripheral circuit 120 to perform a verify operation of verifying the programmed state of the selected memory cells. For example, the program operation controller 140 may control the peripheral circuit 120 to apply a verify voltage to a selected word line and apply a pass voltage to unselected word lines. The program operation controller 140 may receive a pass or fail signal PASS or FAIL from the sensing circuit 126 and determine whether the verify operation has passed.

The program operation controller 140 may receive a suspend command (suspend CMD) and control the peripheral circuit 120 to suspend a program operation that is being performed. The program operation controller 140 may receive a resume command (resume CMD) and control the peripheral circuit 120 to resume the suspended program operation.

The threshold voltage state determiner 150 may determine the amount by which the threshold voltages of the memory cells are shifted while the program operation is suspended. In an embodiment, the threshold voltage state determiner 150 may generate shift information indicating the amount by which the threshold voltages of the memory cells are shifted based on a period of time for which the program operation is suspended. In an embodiment, the threshold voltage state determiner 150 may perform a verify operation using an initial verify voltage in response to a resume command, and generate shift information based on the number of failed bits during the verify operation.

The verify voltage manager 160 may store, in the verify voltage information storage 170, information about a verify voltage to be used during the verify operation. The information about the verify voltage may be information about the initial verify voltage or information about an optimum verify voltage. The information about the initial verify voltage may be stored in the verify voltage information storage 170 when the memory device 100 boots. The verify voltage manager 160 may load the information about the initial verify voltage stored in the memory cell array 110 on the verify voltage information storage 170 when the memory device 100 boots. The optimum verify voltage may be a verify voltage that is determined depending on the degree by which the threshold voltages of the memory cells are shifted while the program operation is suspended. The optimum verify voltage may have a voltage level lower than the initial verify voltage. The verify voltage manager 160 may update the information about the initial verify voltage stored in the verify voltage information storage 170 to the information about the optimum verify voltage before the program operation resumes.

Figure 2:
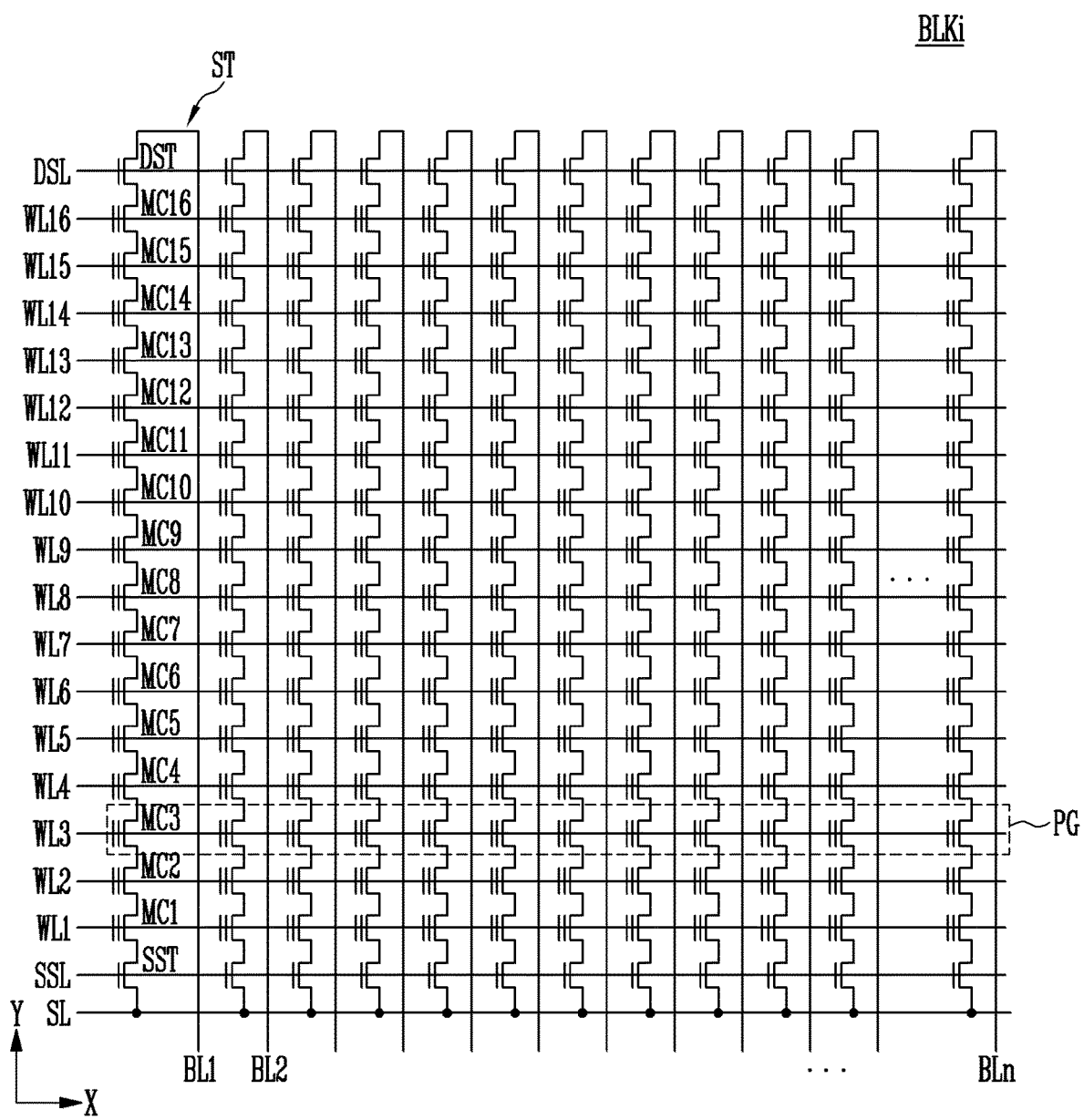
FIG. 2 is a diagram describing a memory block BLKi of FIG. 1.

FIG. 2 is a diagram describing a memory block BLKi of FIG. 1.

Referring to FIG. 2, in the memory block BLKi, a plurality of word lines arranged in parallel to each other may be coupled between a first select line and a second select line. Here, the first select line may be a source select line SSL, and the second select line may be a drain select line DSL. In more detail, the memory block BLKi may include a plurality of strings ST coupled between the bit lines BL1 to BLn and the source line SL. The bit lines BL1 to BLn may be respectively coupled to the strings ST, and the source lines SL may be coupled in common to the strings ST. The strings ST may have the same configuration; therefore, the string ST that is coupled to the first bit line BL1 will be described in detail by way of example.

The string ST may include a source select transistor SST, a plurality of memory cells MC1 to MC16, and a drain select transistor DST which are coupled in series to each other between the source line SL and the first bit line BL1. At least one source select transistor SST and at least one drain select transistor DST may be included in each string ST, and a larger number of memory cells than the number of memory cells MC1 to MC16 shown in the drawing may be included in each string ST.

A source of the source select transistor SST may be coupled to the source line SL, and a drain of the drain select transistor DST may be coupled to the first bit line BL1. The memory cells MC1 to MC16 may be coupled in series between the source select transistor SST and the drain select transistor DST. Gates of the source select transistors SST included in different strings ST may be coupled to the source select line SSL, gates of the drain select transistors DST included in different string ST may be coupled to the drain select line DSL, and gates of the memory cells MC1 to MC16 included in different string ST may be coupled to the plurality of word lines WL1 to WL16. Among the memory cells included in different strings ST, a group of memory cells coupled to each word line may be referred to as a physical page PG. Therefore, the number of physical pages PG included in the memory block BLKi may correspond to the number of word lines WL1 to WL16.

Each memory cell may store 1-bit data. This memory cell is typically called a single level cell (SLC). In this case, each physical page PG may store one logical page (LPG) of data. One logical page (LPG) of data may include data bits corresponding to the number of cells included in a single physical page PG. Furthermore, each memory cell may store 2- or more-bit data. In this case, each physical page PG may store two or more LPGs of data.

Figure 3:
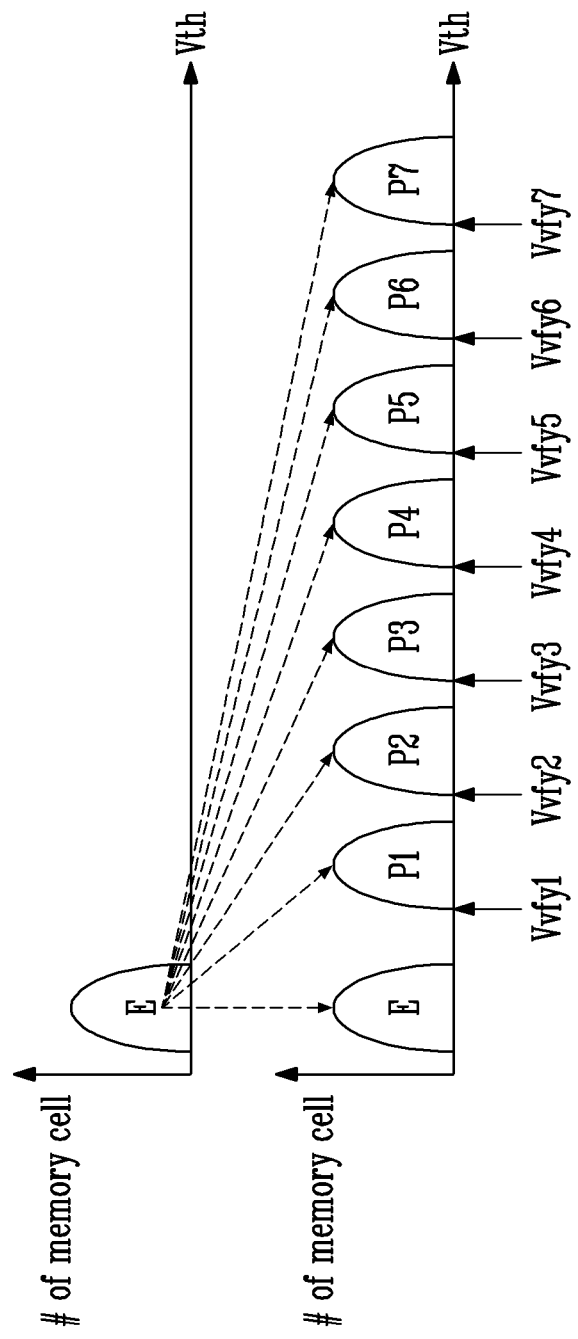
FIG. 3 is a diagram describing the threshold voltage distributions for a plurality of programmed states.

FIG. 3 is a diagram describing threshold voltage distributions of a plurality of programmed states.

Referring to FIG. 3, each memory cell may be programmed to one of an erased state E and seven programmed states P1 to P7 depending on a threshold voltage. For the sake of description, the memory cell according to the present invention disclosure is illustrated as being a triple level cell (TLC) which can be programmed to any one of the one erased state and the seven programmed states, but embodiments of the present invention disclosure are not limited thereto. For example, the memory cell may be a multi level cell (MLC), a single level cell (SLC), or a quad level cell (QLC). Although for the sake of description the erased state is separated from the programmed states, the erased state may be expressed as a zeroth programmed state P0. Therefore, the erased state E and the seven programmed states P1 to P7 may be expressed as programmed states.

The memory cells coupled to a selected word line may have threshold voltages included in any one state of the erased state E and the seven programmed states P1 to P7. For example, the memory cells may be programmed to have threshold voltages included in any one state of the erased state E and the seven programmed states P1 to P7. Before a program operation is performed, the memory cells may be in the erased state E. During the program operation, memory cells that are in the erased state E may be programmed to any one programmed states of the seven programmed states when the program voltage is applied to the selected word line.

The states of the memory cells may be separated from each other by verify voltages. For example, the erased state E and the first programmed state P1 may be separated from each other by a first verify voltage Vvfy1. The first programmed state P1 and the second programmed state P2 may be separated from each other by a second verify voltage Vvfy2. The second programmed state P2 and the third programmed state P3 may be separated from each other by a third verify voltage Vvfy3. The third programmed state P3 and the fourth programmed state P4 may be separated from each other by a fourth verify voltage Vvfy4. The fourth programmed state P4 and the fifth programmed state P5 may be separated from each other by a fifth verify voltage Vvfy5. The fifth programmed state P5 and the sixth programmed state P6 may be separated from each other by a sixth verify voltage Vvfy6. The sixth programmed state P6 and the seventh programmed state P7 may be separated from each other by a seventh verify voltage Vvfy7.

In the program method illustrated in FIG. 3, seven programmed states P1 to P7 may be formed from one erase state E. The programmed states illustrated in FIG. 3 may be formed while a program operation including first to n-th program loops illustrated in FIG. 4 is performed once.

Figure 4:
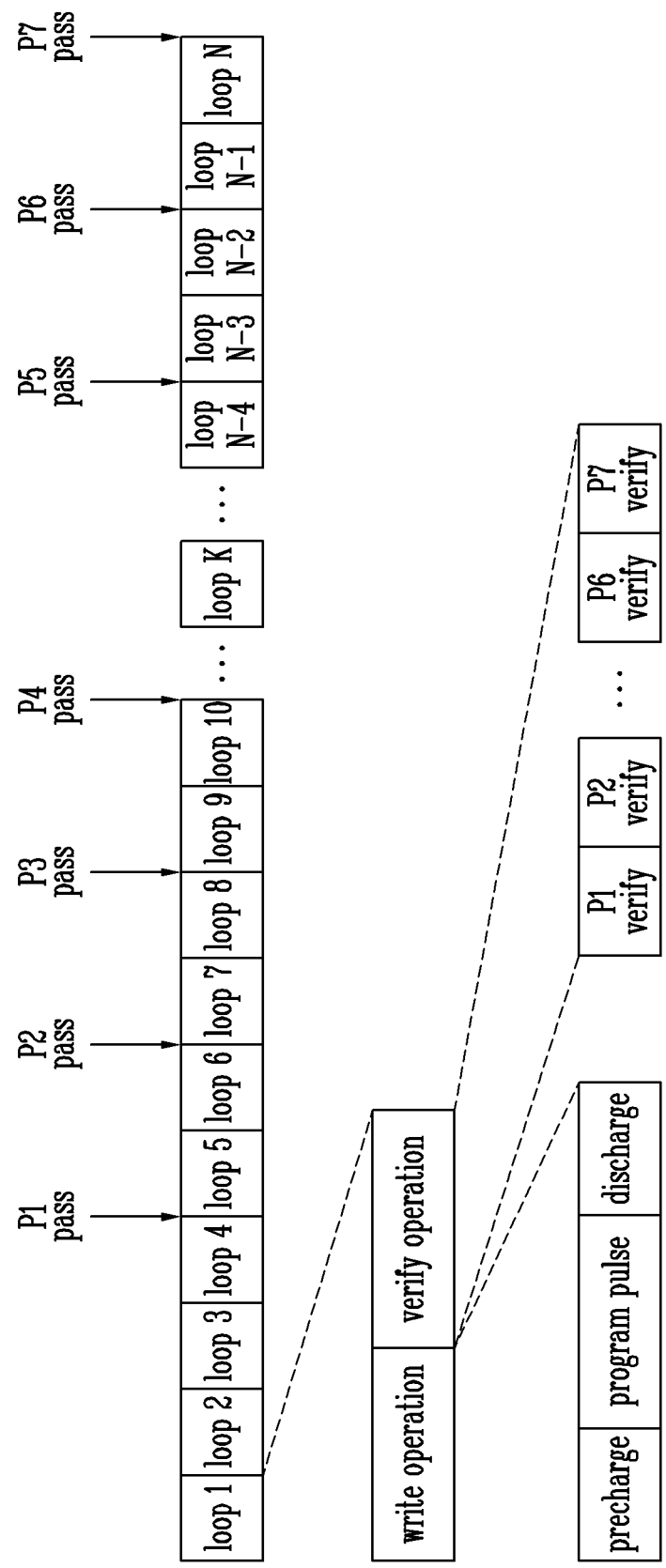
FIG. 4 is a diagram describing a program operation.

FIG. 4 is a diagram describing a program operation.

Referring to FIG. 4, the program operation may include a plurality of program loops. For example, the program operation may include a first program loop (program loop 1) to an N-th program loop (program loop N). The memory device 100 may perform a plurality of program loops such that the selected memory cells have threshold voltages corresponding to any one of a plurality of programmed states.

The plurality of programmed states may be separated from each other based on threshold voltages. For example, in the case where memory cells included in a selected page are operated as single level cells (SLCs), the plurality of programmed states may be separated into an erased state and a programmed state. In the case where memory cells included in a selected page are operated as multi level cells (MLCs), the plurality of programmed states may be separated into one erased state and three programmed states.

A program loop may include a write operation step and a verify operation step.

The write operation step may be the step at which a program voltage is applied to a selected word line. The write operation step may include a precharge period, a program voltage application period (a program pulse period), and a discharge period. During the precharge period, a program enable voltage may be precharged to a selected bit line, and a program inhibit voltage may be precharged to unselected bit lines. During the program pulse period, a program voltage may be applied to the selected word line, and a pass voltage may be applied to unselected word lines. During the discharge period, the voltages precharged to the bit lines and the voltages applied to the word lines may be discharged.

In the verify operation step the verify voltage is applied to the selected word line to verify the programmed states of the selected memory cells. For example, the verify operation step may be the step at which the verify operation described with reference to FIG. 1 is performed. For example, the memory device 100 may perform at least one of verify steps including a first programmed state verify step (P1 verify) of applying a first verify voltage Vvfy1 to the selected word line to verify the first programmed state to a seventh programmed state verify step (P7 verify) of applying a seventh verify voltage Vvfy7 to the selected word line to verify the seventh programmed state.

Memory cells that have threshold voltages higher than the verify voltage may be determined to have been programmed to target programmed states, and may enter a program inhibit state in a subsequent program loop. For example, a memory cell determined to be an off-cell when the verify voltage is applied to the selected word line may enter the program inhibit state in a subsequent program loop. A program inhibit voltage may be precharged to a bit line coupled with a cell string including a memory cell having the program inhibit state.

Memory cells that have threshold voltages lower than the verify voltage may be determined to have not been programmed to the target programmed states, and may enter a program enable state in the subsequent program loop. For example, a memory cell determined to be an on-cell when the verify voltage is applied to the selected word line may enter the program enable state in the subsequent program loop. A program enable voltage may be precharged to a bit line coupled with a cell string including a memory cell having the program enable state.

The sensing circuit 126 may determine whether the verify operation has passed. In the case where the number of memory cells determined to be off-cells among memory cells having the same target programmed state is greater than an enable number, the verify operation may pass. The enable number may be determined depending on an enable bit signal VRYBIT. For example, in the case where the number of memory cells determined to be off-cells by a target verify voltage is greater than the enable number, the verify operation for the target programmed state may pass. In the case where the verify operation for the target programmed state has passed, the sensing circuit 126 may generate a pass signal. In the case where the number of memory cells determined to be off-cells by the target verify voltage is less than the enable number, the verify operation for the target programmed state may fail. In the case where the verify operation for the target programmed state has failed, the sensing circuit 126 may generate a fail signal.

As illustrated in FIG. 4, a verify operation for the first programmed state may pass in a fourth program loop (loop 4). For example, the number of memory cells that have passed a verification among memory cells having the first programmed state may become greater than the enable number in the fourth program loop. Likewise, a verify operation for the second programmed state, a verify operation for the third programmed state, a verify operation for the fourth programmed state, a verify operation for the fifth programmed state, a verify operation for the sixth programmed state, and a verify operation for the seventh programmed state may respectively pass verifications in the sixth program loop, the eighth program loop, the tenth program loop, the N-4-th program loop, the N-2-th program loop, and the N-th program loop.

Figure 5:
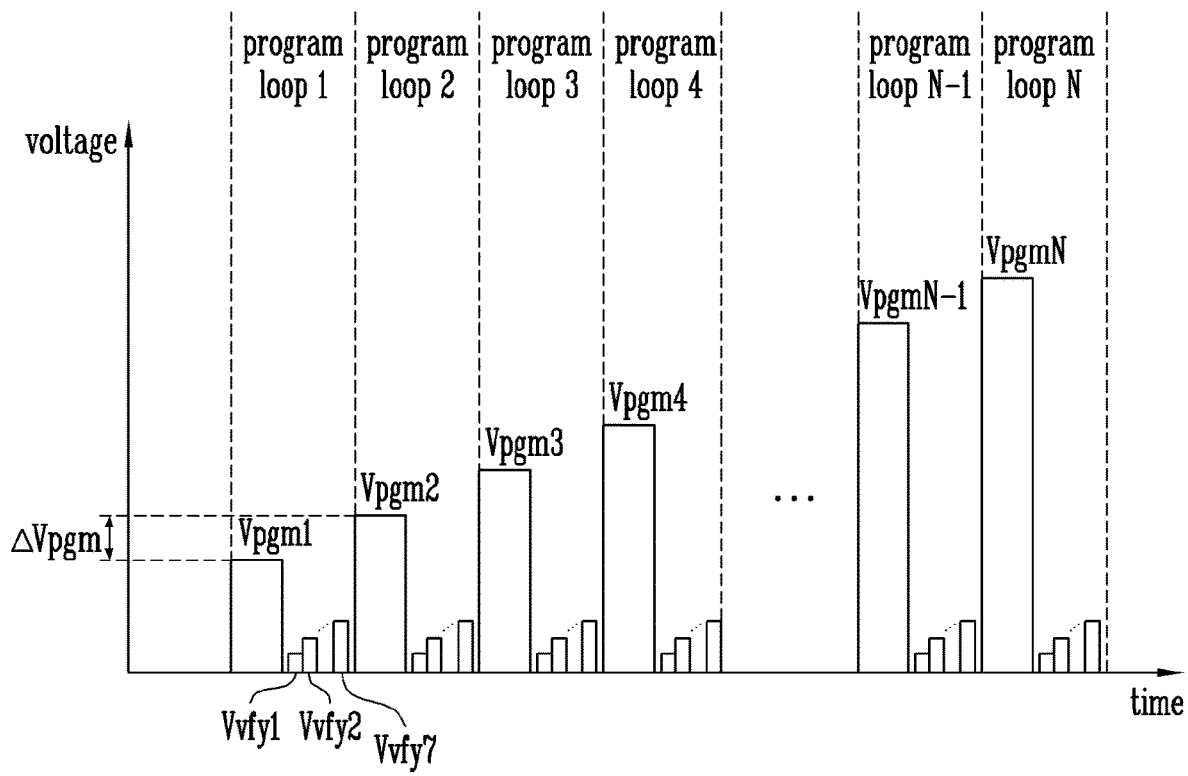
FIG. 5 is a diagram describing a voltage applied to a selected word line as a function of time during a program operation.

FIG. 5 is a diagram describing a voltage to be applied to a selected word line as a function of time during a program operation.

Referring to FIG. 5, a program operation for forming the programmed states of FIG. 3 may include N program loops. Each program loop may include a write operation step and a verify operation step. At the write operation step, a program voltage may be applied to the selected word line. At the verify operation step, a verify voltage may be applied to the selected word line. For example, a first program voltage Vpgm1 and a plurality of verify voltages Vvfy1 to Vvfy7 may be applied to the selected word line in the first program loop. Although FIG. 5 illustrates that seven verify voltages are applied to the selected word line in each program loop, an operation of applying on or more of the verify voltages may be skipped during a program operation in accordance with an embodiment.

As the program loops are sequentially performed, the program voltage may be increased by a step voltage ΔVpgm. For example, a second program voltage Vpgm2 to be applied to the selected word line in the second program loop may be greater by the step voltage ΔVpgm than the first program voltage Vpgm1. Although the step voltage is illustrated as being fixed, the step voltage may vary.

A memory cell that reaches a target programmed state while the plurality of program loops are performed may enter a program inhibit state so that the program operation is no longer performed on the memory cell. For example, a memory cell determined to be an off-cell may enter the program inhibit state. Therefore, the threshold voltages of memory cells that are determined to be off-cells and are in the program inhibit state may be maintained even if a subsequent program loop is performed.

Figure 6:
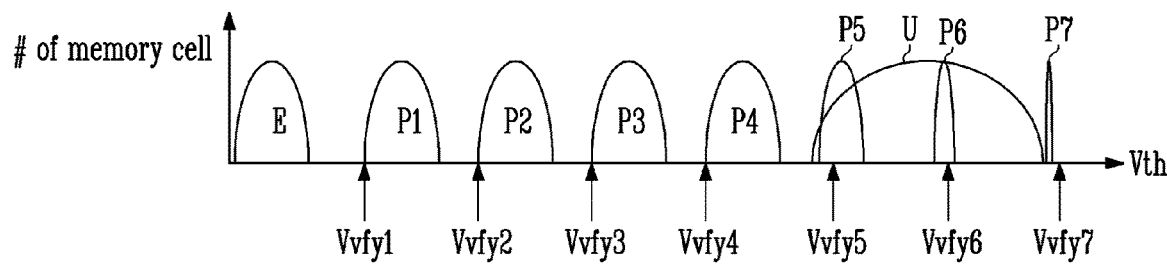
FIG. 6 is a diagram describing threshold voltage distributions when the program operation is suspended.

FIG. 6 is a diagram describing threshold voltage distributions when the program operation is suspended.

Referring to FIG. 6, while a write operation for the fifth programmed state P5 is performed, the program operation may be suspended. For example, after a K-th program loop (loop K) illustrated in FIG. 4 has been performed, the program operation may be suspended. If the K-th program loop (loop K) has been performed, verify operations for the first programmed state P1 to the fourth programmed state P4 may have passed, and verify operations for the fifth programmed state P5 to the seventh programmed state P7 may have failed.

The first programmed state P1 may be formed by threshold voltages higher than the first verify voltage Vvfy1. The second programmed state P2 may be formed by threshold voltages higher than the second verify voltage Vvfy2. The third programmed state P3 may be formed by threshold voltages higher than the third verify voltage Vvfy3. The fourth programmed state P4 may be formed by threshold voltages higher than the fourth verify voltage Vvfy4. The fifth programmed state P5 may be formed by threshold voltages higher than the fifth verify voltage Vvfy5. The sixth programmed state P6 may be formed by threshold voltages higher than the sixth verify voltage Vvfy6. The seventh programmed state P7 may be formed by threshold voltages higher than the seventh verify voltage Vvfy7.

If the program operation is suspended after the K-th program loop (loop K) has been performed, some of the memory cells having the fifth to seventh programmed states P5 to P7 as the target programmed states may be determined to be on-cells by the fifth to seventh verify voltages Vvfy5 to Vvfy7, and some of the memory cells may be determined to be off-cells. The threshold voltages of the memory cells determined to be on-cells by respective verify voltages may form an uncertain threshold voltage distribution U.

Figure 7:
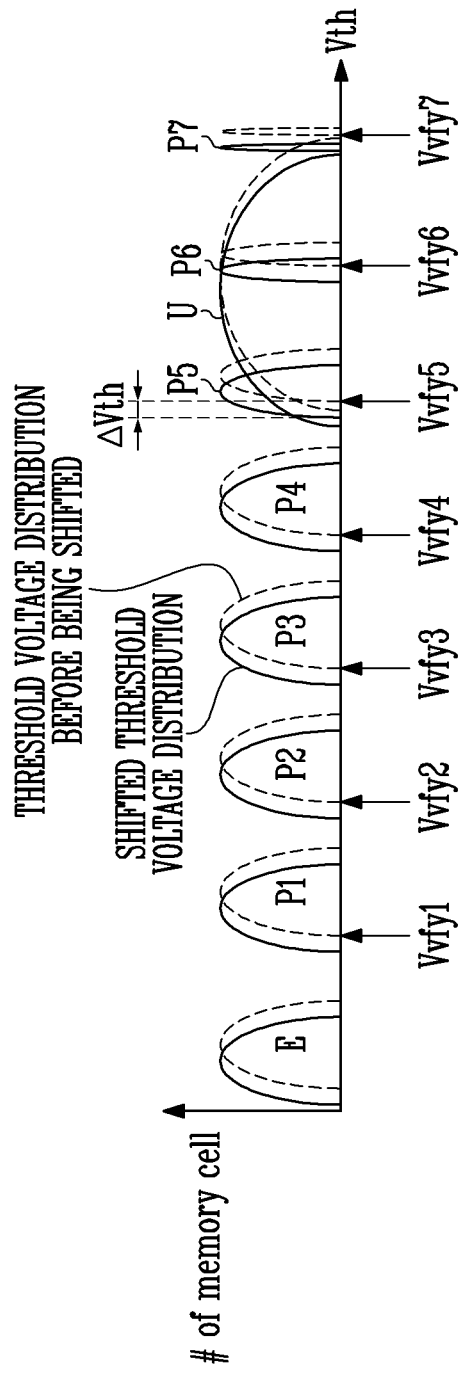
FIG. 7 is a diagram describing threshold voltage distributions which shift while the program operation is suspended.

FIG. 7 is a diagram describing threshold voltage distributions which shift while the program operation is suspended.

Referring to FIG. 7, the threshold voltages of selected memory cells may be shifted. For example, since electrons come out from space in memory cells storing charges while the program operation is suspended, the threshold voltages of the selected memory cells may be reduced. The space for storing charges may be a floating gate or a charge trap layer.

Based on the fifth programmed state P5, a left tail of the fifth programmed state P may be shifted to the left by a shift threshold voltage ΔVth while the program operation is suspended.

Figure 8:
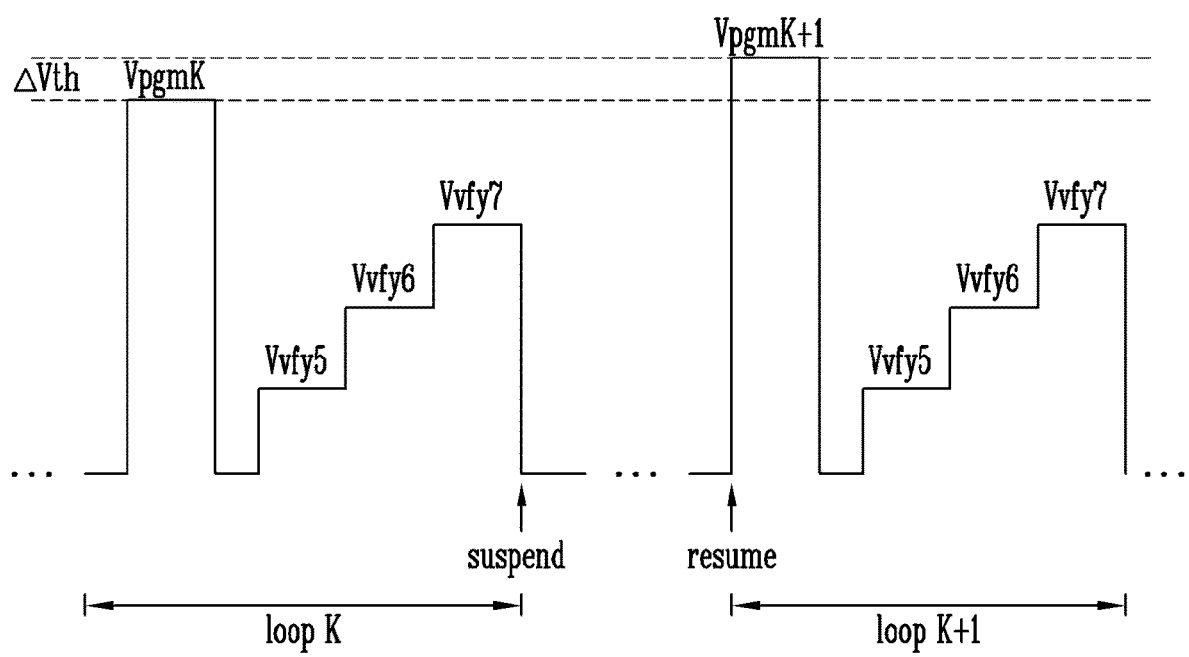
FIG. 8 is a diagram describing voltages to be applied to a selected word line when the program operation is suspended and resumed.

FIG. 8 is a diagram describing voltages to be applied to a selected word line when the program operation is suspended and resumed.

Referring to FIG. 8, in the K-th program loop (loop K), a K-th program voltage VpgmK, the fifth verify voltage Vvfy5, the sixth verify voltage Vvfy 6, and the seventh verify voltage Vvfy 7 may be sequentially applied to the selected word line. In a (K+1)-th program loop (loop K+1), a (K+1)-th program voltage VpgmK+1, the fifth verify voltage Vvfy5, the sixth verify voltage Vvfy 6, and the seventh verify voltage Vvfy 7 may be sequentially applied to the selected word line. The (K+1)-th program voltage VpgmK+1 may be greater by a step voltage ΔVpgm than the K-th program voltage VpgmK.

After the K-th program loop (loop K) has been performed, the program operation may be suspended. If the program operation is resumed, the (K+1)-th program loop (loop K+1) may be performed. As illustrated in FIG. 4, the K-th program loop (loop K) may be performed in a state in which a verify operation for the fourth program state P4 has passed. Therefore, in the K-th program loop (loop K), verify operations for the fifth to seventh programmed states P5 to P7 may be performed. When the (K+1)-th program loop (loop K+1) is performed, the threshold voltages of the selected memory cells may be in a shifted state, as illustrated in FIG. 7. Therefore, in the case where verify operations are performed using the fifth to seventh verify voltages Vvfy5 to Vvfy7 in the (K+1)-th program loop (loop K+1), the distribution widths of the fifth to seventh programmed states P5 to P7 may be increased.

Figure 9:
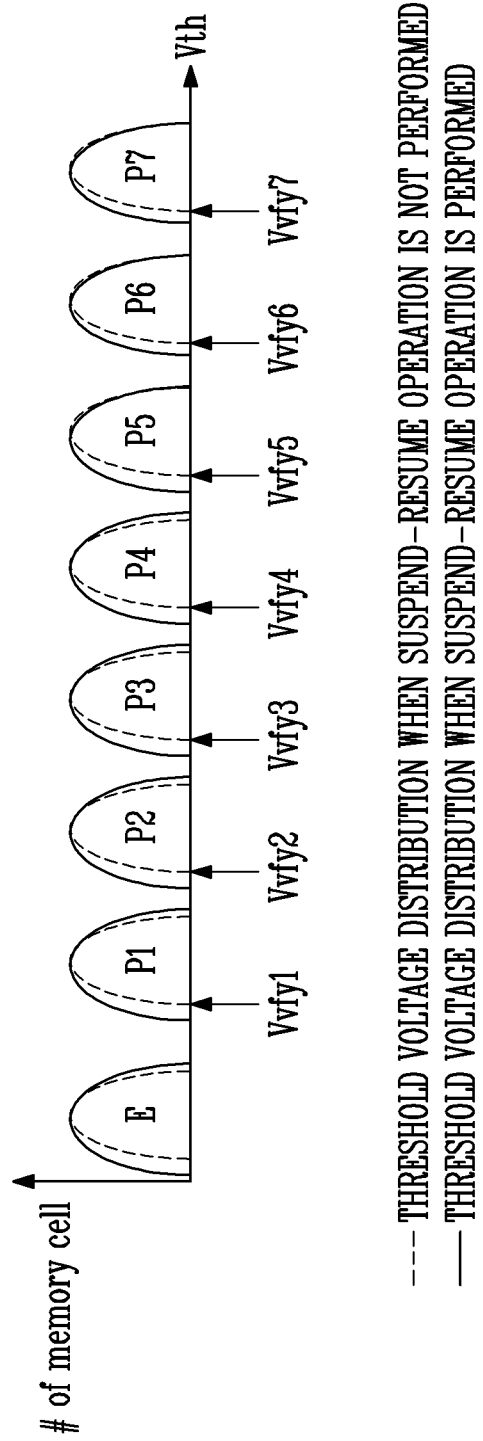
FIG. 9 is a diagram describing threshold voltage distributions formed after the program operation is resumed.

FIG. 9 is a diagram describing threshold voltage distributions formed after the program operation is resumed.

Referring to FIG. 9, if suspend and resume operations are performed, the distribution widths corresponding to the erased state E and to the seventh programmed state P7 may be increased, compared to that of the case where the suspend and resume operations are not performed.

For example, if the program operation is resumed, threshold voltage distributions using the fifth verify voltage Vvfy5 to the seventh verify voltage Vvfy7 may be added to the threshold voltage distributions shifted to the left, so that the distribution widths corresponding to the fifth to seventh programmed states P5 to P7 may be increased.

Here, the erased state E to the fourth programmed state P4 that are shifted to the left may be moved away from the fifth programmed state P5 to the seventh programmed state P7. Therefore, the distribution widths of the erased state E to the fourth programmed state P4 may be increased to the right because of the effects of the fifth to seventh programmed states P5 to P7.

Consequently, if a verify operation of the (K+1)-th program loop (loop K+1) is performed using the same voltage level as that of the verify voltage used in the K-th program loop (loop K), the width of the threshold voltage distribution of the selected memory cells may be increased.

Figure 10:
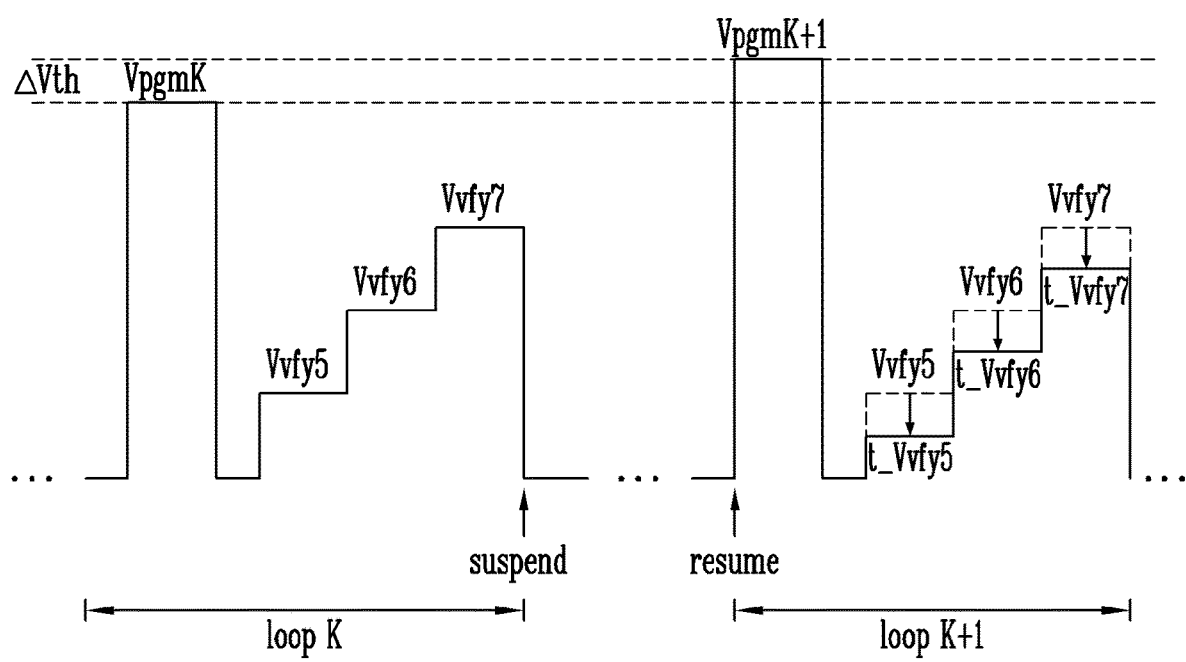
FIG. 10 is a diagram describing a verify operation using an optimum verify voltage.

FIG. 10 is a diagram describing a verify operation using an optimum verify voltage.

Referring to FIG. 10, the memory device 100 in accordance with an embodiment may perform a verify operation using an optimum verify voltage when the program operation is resumed. For example, in the (K+1)-th program loop (loop K+1), verify operations using the optimum verify voltages t_Vvfy5 to t_Vvfy7 may be performed.

The voltage levels of the optimum verify voltages t_Vvfy5 to t_Vvfy7 may be determined depending on the amount by which the threshold voltages of the selected memory cells are shifted while the program operation is suspended. The optimum verify voltages t_Vvfy5 to t_Vvfy7 may have voltage levels lower than the fifth to seventh verify voltages Vvfy5 to Vvfy7.

If the voltage level of the verify voltage is reduced by the amount by which the threshold voltages of the selected memory cells are shifted, the threshold voltage distribution width of the selected memory cells may not be increased. For example, if the voltage levels of the verify voltages to be used during the verify operations of the (K+1)-th program loop (loop K+1) are reduced, the same distribution width as that of the threshold voltage distribution in the case where the program operation is not suspended may be maintained.

Figure 11:
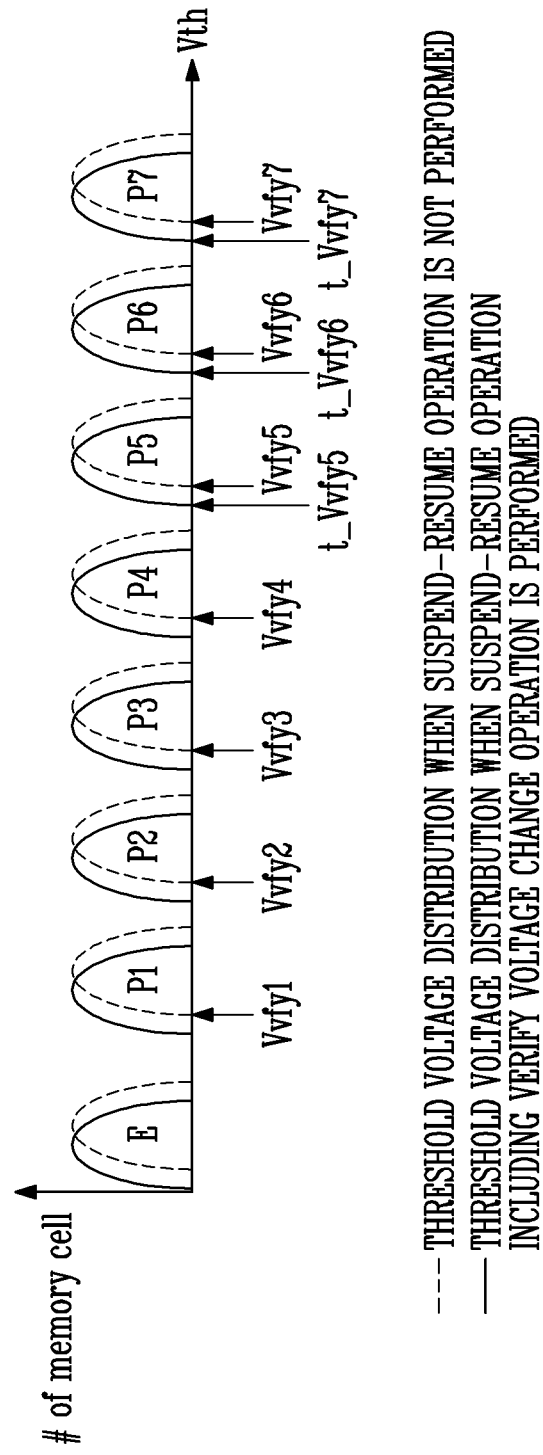
FIG. 11 is a diagram describing threshold voltage distributions formed by an operation of reducing a verify voltage.

FIG. 11 is a diagram describing threshold voltage distributions formed by an operation of reducing a verify voltage.

Referring to FIG. 11, even if the program operation is suspended and resumed, the widths of the threshold voltage distributions may not be increased. For example, in the case where the verify operations using the optimum verify voltages t_Vvfy5 to t_Vvfy7 are performed after the program operation is resumed, the widths of the distributions corresponding to the fifth programmed state P5 to the seventh programmed state P7 may not be increased.

Furthermore, since the erased state E to the fourth programmed state P4 that are shifted to the left are not moved away from the fifth programmed state P5 to the seventh programmed state P7, the widths of the distributions thereof may not be increased to the right.

Therefore, the widths of the distributions of the erased state E to the seventh programmed state P7 may be the same as that of the case where the suspend and resume operations of the program operation are not performed.

Figure 12:
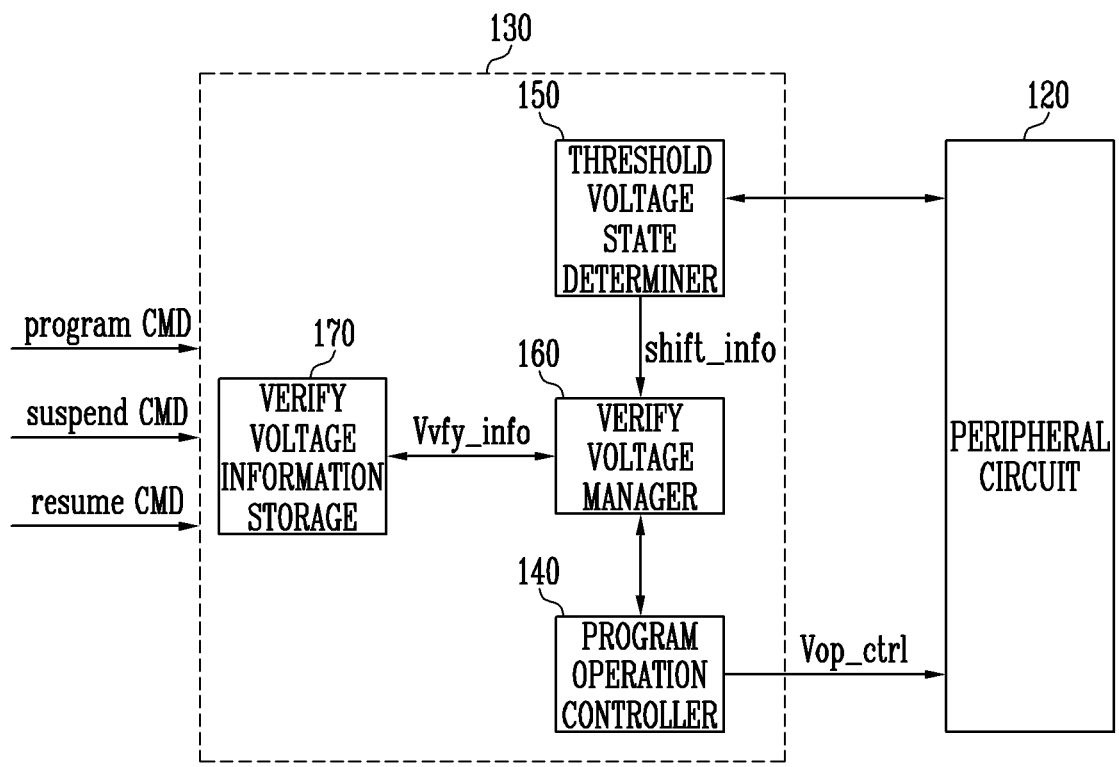
FIG. 12 is a diagram describing a control logic in accordance with an embodiment of the present invention disclosure.

FIG. 12 is a diagram describing the control logic 130 in accordance with an embodiment.

Referring to FIG. 12, the control logic 130 may include a program operation controller 140, a threshold voltage state determiner 150, a verify voltage manager 160, and a verify voltage information storage 170.

The program operation controller 140 may generate an operation voltage control signal Vop_ctrl to apply an operating voltage such as a program voltage, a verify voltage, a pass voltage, or a bit line precharge voltage to a word line or a bit line.

The verify voltage manager 160 may transmit information Vvfy_info about a verify voltage to the program operation controller 140. The information Vvfy_info about the verify voltage may be information about the initial verify voltage or information about an optimum verify voltage.

The verify voltage manager 160 may load the information about the initial verify voltage stored in the memory cell array 110 on the verify voltage information storage 170 when the memory device 100 boots. The information about the initial verify voltage may be information about the first to seventh verify voltages Vvfy1 to Vvfy7.

The verify voltage manager 160 may transmit the information about the initial verify voltage to the program operation controller 140 before a resume command (resume CMD) is received.

The verify voltage manager 160 may generate information about the optimum verify voltage when the resume CMD is received, and transmit the information about the optimum verify voltage to the program operation controller 140. The optimum verify voltage may have a voltage level lower than the initial verify voltage. The verify voltage manager 160 may receive shift information shift_info from the threshold voltage state determiner 150 and adjust the voltage level of the optimum verify voltage based on the shift information shift_info. The verify voltage manager 160 may update the information about the initial verify voltage stored in the verify voltage information storage 170 to the information about the optimum verify voltage.

The threshold voltage state determiner 150 may generate shift information shift_info indicating the amount by which the threshold voltages of the selected memory cells are shifted during a period from when a suspend command (suspend CMD) is received to when the resume CMD is received.

In an embodiment, the threshold voltage state determiner 150 may generate the shift information shift_info based on the period from when the suspend CMD is received to when the resume CMD is received. For example, the shift information shift_info may be information about a period of time from when the suspend CMD is received to when the resume CMD is received. As the period of time for which the program operation is suspended is increased, the verify voltage manager 160 may reduce the voltage level of the optimum verify voltage.

In an embodiment, the threshold voltage state determiner 150 may control the peripheral circuit 120 to perform a preliminary verify operation using the initial verify voltage in response to the resume CMD, and generate shift information shift_info based on the number of memory cells determined to be on-cells obtained in the preliminary verify operation. For example, the shift information shift_info may be information about the number of memory cells determined to be on-cells obtained in the preliminary verify operation. As the number of fail bits is increased, the verify voltage manager 160 may reduce the voltage level of the optimum verify voltage.

Figure 13:
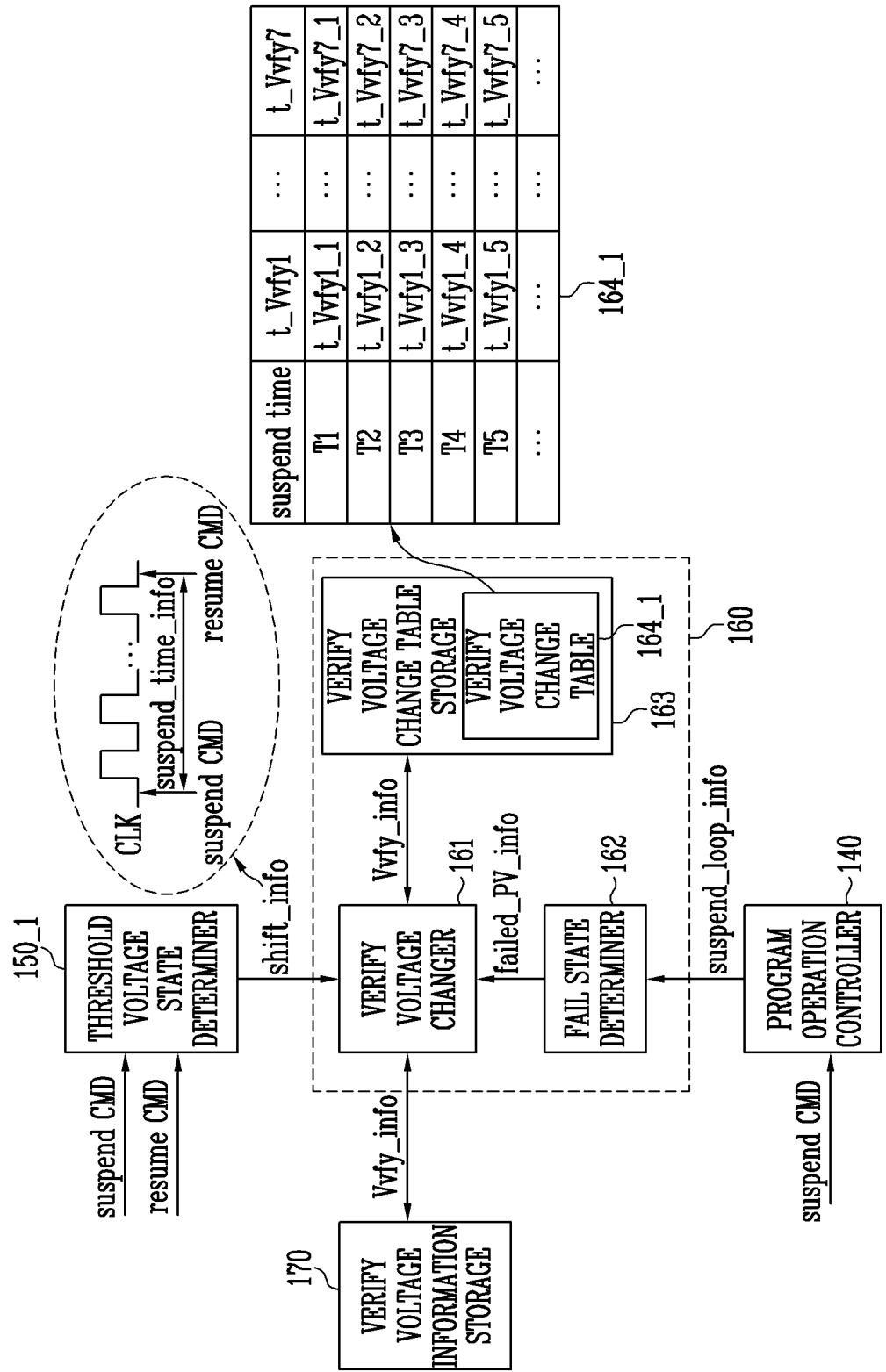
FIG. 13 is a diagram for a method of operating the memory device in accordance with an embodiment of the present invention disclosure.

FIG. 13 is a diagram describing a control logic in accordance with an embodiment.

Referring to FIG. 13, a threshold voltage state determiner 150_1 in accordance with an embodiment may generate suspended time information suspend_time_info that is information about a period of time from when a suspend CMD is received to when a resume CMD is received, and transmit the suspended time information suspend_time_info to the verify voltage manager 160. In an embodiment, the suspended time information suspend_time_info may be the shift information shift_info described in FIG. 12. For example, the threshold voltage state determiner 150_1 may count the number of clock edges during the period of time from when the suspend CMD is received to when the resume CMD is received. The clock edges may include at least one of a rising edge or a falling edge. The threshold voltage state determiner 150_1 may determine the counted number of edges as the suspended time information suspend_time_info.

The program operation controller 140 may receive a suspend CMD and transmit, to the fail state determiner 162, information suspend_loop_info about a suspended program loop that has been performed before the program operation is suspended.

The verify voltage manager 160 may include a verify voltage changer 161, a fail state determiner 162, and a verify voltage change table storage 163.

The fail state determiner 162 may receive the information suspend_loop_info about the suspended program loop, and generate information failed_PV_info about one or more programmed states that failed verification in the suspended program loop. The fail state determiner 162 may transmit the information failed_PV_info about the one or more programmed states that failed verification in the suspended program loop to the verify voltage changer 161. For example, as illustrated in FIG. 8, if the K-th program loop (loop K) is suspended, the fail state determiner 162 may transmit information about the fifth to seventh programmed states P5 to P7, as the information failed_PV_info about the programmed states that have failed verification in the suspended program loop, to the verify voltage changer 161.

The verify voltage changer 161 may obtain, from the verify voltage change table storage 163, the voltage level of an optimum verify voltage corresponding to the programmed state that has failed the verification based on the information failed_PV_info about the programmed state that has failed the verification provided from the fail state determiner 162 and the suspended time information suspend_time_info provided from the threshold voltage state determiner 150_1. For example, in the case where the K-th program loop (loop K) is suspended, the verify voltage changer 161 may obtain, as the voltage levels of the optimum verify voltages corresponding to the programmed states that have failed the verification, the voltage levels of the fifth to seventh optimum verify voltages t_Vvfy5 to t_Vvfy7 corresponding to a particular time among the suspended time ("T1" to "T5" and so forth) with reference to the verify voltage change table 164_1 based on the information failed_PV_info about the programmed state that has failed the verification provided from the fail state determiner 162 and the suspended time information suspend_time_info provided from the threshold voltage state determiner 150_1.

The verify voltage changer 161 may receive the suspended time information suspend_time_info from the threshold voltage state determiner 150_1 and determine the voltage level of the optimum verify voltage based on the programmed state that has failed the verification (i.e., the information failed_PV_info) and the suspended time (i.e., the suspended time information). For example, the verify voltage changer 161 may obtain, as the information Vvfy_info about the verify voltage, information of the voltage level of an optimum verify voltage corresponding to the programmed state that has failed the verification and corresponding to the suspended time with reference to the verify voltage change table 164_1 stored in the verify voltage change table storage 163. The verify voltage change table 164_1 may be a table including information about relationship between the suspended time and the first to seventh optimum verify voltages t_Vvfy1 to t_Vvfy7 corresponding to the programmed states of failed verification. For example, in the case where the K-th program loop (loop K) is suspended and the suspended time is T1, the verify voltage changer 161 may obtain a 5-1-th voltage level t_Vvfy5_1 to a 7-1-th voltage level t_Vvfy7_1, as the voltage levels of the optimum verify voltages corresponding to the programmed states that have failed the verification, from the verify voltage change table storage 163 based on the information failed_PV_info about the programmed state P5 to P7 that has failed the verification provided from the fail state determiner 162 and the suspended time information suspend_time_info (i.e., the information of "T1") provided from the threshold voltage state determiner 150_1.

For example, the verify voltage changer 161 may obtain, as the information Vvfy_info about the verify voltage, the voltage level of the optimum verify voltage corresponding to the programmed state that has failed the verification based on the suspended time information suspend_time_info received from the threshold voltage state determiner 150_1 and the information failed_PV_info corresponding to the programmed state that has failed the verification received from the fail state determiner 162.

Before the program operation resumes, the verify voltage changer 161 may update the information Vvfy_info stored in the verify voltage information storage 170 from the information about the initial verify voltage to the information about the obtained voltage level of the optimum verify voltage corresponding to the programmed state that has failed the verification and corresponding to the suspended time.

Figure 14:
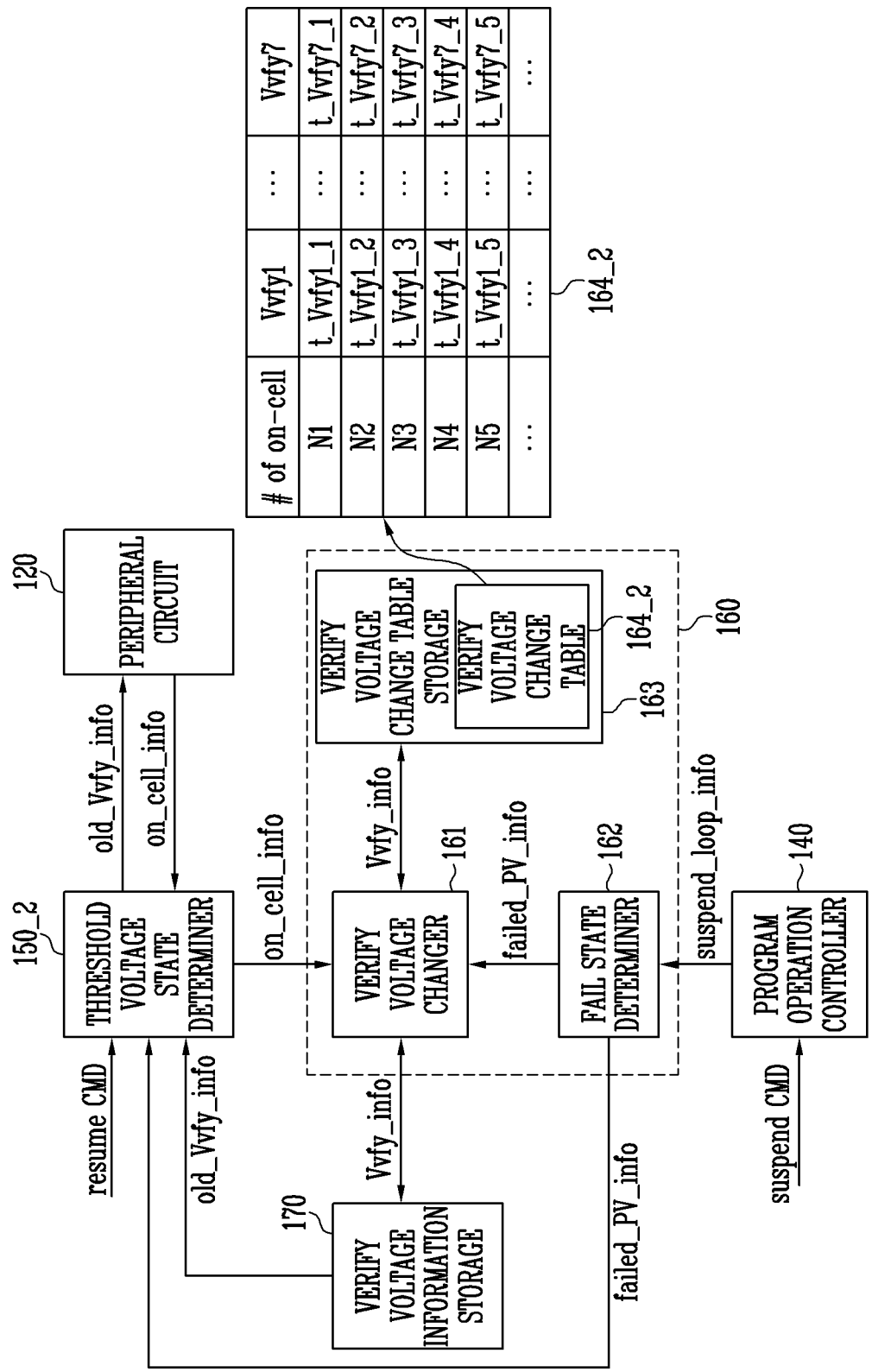
FIG. 14 is a diagram describing a method of determining a threshold voltage shift in accordance with an embodiment of the present invention disclosure.

FIG. 14 is a diagram describing a control logic in accordance with an embodiment.

Referring to FIG. 14, a threshold voltage state determiner 150_2 in accordance with an embodiment may obtain, from the verify voltage information storage 170, information old_Vvfy_info about an initial verify voltage in response to a resume CMD. The threshold voltage state determiner 150_2 may control the peripheral circuit 120 to perform a preliminary verify operation using the initial verify voltage indicated by the information old_Vvfy_info. The threshold voltage state determiner 150_2 may receive, from the peripheral circuit 120, on-cell information on_cell_info indicating the number of memory cells determined to be on-cells obtained during the preliminary verify operation. The on-cell information on_cell_info may indicate the number of memory cells having threshold voltages lower than the voltage level of the initial verify voltage.

The threshold voltage state determiner 150_2 may receive, from the fail state determiner 162, the information failed_PV_info about one or more programmed states that have failed verification in the suspended program loop. The threshold voltage state determiner 150_2 may control the peripheral circuit 120 to perform the preliminary verify operation for a programmed state that has passed verification using the initial verify voltage indicated by the information old_Vvfy_info. For example, in the case where the K-th program loop (loop K) is suspended, the threshold voltage state determiner 1502 may obtain, from the verify voltage information storage 170, the information old_Vvfy_info about an initial verify voltage for any one programmed state of the first to fourth programmed states P1 to P4 that have passed verification in response to a resume CMD. The threshold voltage state determiner 150_2 may receive, from the peripheral circuit 120, the on-cell information on_cell_info as a result of the preliminary verify operation on the first to fourth programmed states P1 to P4 that have passed verification (obtained from the information failed_PV_info) using the initial verify voltages (obtained from the information old_Vvfy_info). The threshold voltage state determiner 150_2 may transmit the on-cell information on_cell_info to the verify voltage changer 161. In an embodiment, the on-cell information on_cell_info may be the shift information shift_info described in FIG. 12.

The program operation controller 140 may receive a suspend CMD and transmit, to the fail state determiner 162, information suspend_loop_info about a suspended program loop that has been performed before the K-th program loop (loop K) is suspended.

The program operation controller 140 may receive a suspend CMD and transmit, to the fail state determiner 162, the information suspend_loop_info about a suspended program loop that has been performed before the program operation is suspended.

The fail state determiner 162 may receive the information suspend_loop_info about the suspended program loop, and generate the information failed_PV_info about one or more programmed states that have failed verification in the suspended program loop. The fail state determiner 162 may transmit the information failed_PV_info about the one or more programmed states that have failed verification in the suspended program loop to the verify voltage changer 161. For example, as illustrated in FIG. 8, if the K-th program loop (loop K) is suspended, the fail state determiner 162 may transmit information about the fifth to seventh programmed states P5 to P7, as the information failed_PV_info about the programmed states that have failed verification in the suspended program loop, to the verify voltage changer 161.

The verify voltage changer 161 may obtain, from the verify voltage change table storage 163, the voltage level of an optimum verify voltage corresponding to the programmed state that has failed the verification based on the information failed_PV_info about the programmed state that has failed the verification provided from the fail state determiner 162 and the on-cell information on_cell_info provided from the threshold voltage state determiner 150_2. For example, in the case where the K-th program loop (loop K) is suspended, the verify voltage changer 161 may obtain, as the voltage levels of the optimum verify voltages corresponding to the programmed states that have failed the verification, the voltage levels of the fifth to seventh optimum verify voltages t_Vvfy5 to t_Vvfy7 corresponding to a particular range among the ranges of a number of on-cells ("N1" to "N5" and so forth) with reference to the verify voltage change table 164_2 based on the information failed_PV_info about the programmed state that has failed the verification provided from the fail state determiner 162 and the on-cell information on_cell_info provided from the threshold voltage state determiner 150_2.

The verify voltage changer 161 may receive the on-cell information on_cell_info from the threshold voltage state determiner 150_2 and determine the voltage level of the optimum verify voltage corresponding to the programmed state that has failed the verification based on the programmed state that has failed the verification (i.e., the information failed_PV_info) and the number of on-cells (i.e., the on-cell information on_cell_info). For example, the verify voltage changer 161 may obtain, as the information Vvfy_info about the verify voltage, information of the voltage level of an optimum verify voltage corresponding to the programmed state that has failed the verification and corresponding to the number of on-cells with reference to the verify voltage change table 164_2 stored in the verify voltage change table storage 163. The verify voltage change table 164_2 may be a table including information about a relationship between the range of the number of on-cells and the first to seventh optimum verify voltages t_Vvfy1 to t_Vvfy7 corresponding to the programmed states of failed verification. For example, in the case where the K-th program loop (loop K) is suspended and the range of the number of on-cells is N1, the verify voltage changer 161 may obtain a 5-1-th voltage level t_Vvfy5_1 to a 7-1-th voltage level t_Vvfy7_1, as the voltage levels of the optimum verify voltages corresponding to the programmed states that have failed the verification, from the verify voltage change table storage 163 based on the information failed_PV_info about the programmed state P5 to P7 that has failed the verification provided from the fail state determiner 162 and the range of the number of on-cells (i.e., the on-cell information on_cell_info of "N1") provided from the threshold voltage state determiner 150_2.

For example, the verify voltage changer 161 may obtain, as the information Vvfy_info about the verify voltage, the voltage level of the optimum verify voltage corresponding to the programmed state that has failed the verification based on the on-cell information on_cell_info received from the threshold voltage state determiner 150_2 and the information failed_PV_info corresponding to the programmed state that has failed the verification received from the fail state determiner 162.

Before the program operation resumes, the verify voltage changer 161 may update the information Vvfy_info stored in the verify voltage information storage 170 from the information about the initial verify voltage to the information about the obtained voltage level of the optimum verify voltage corresponding to the programmed state that has failed the verification.

Figure 15:
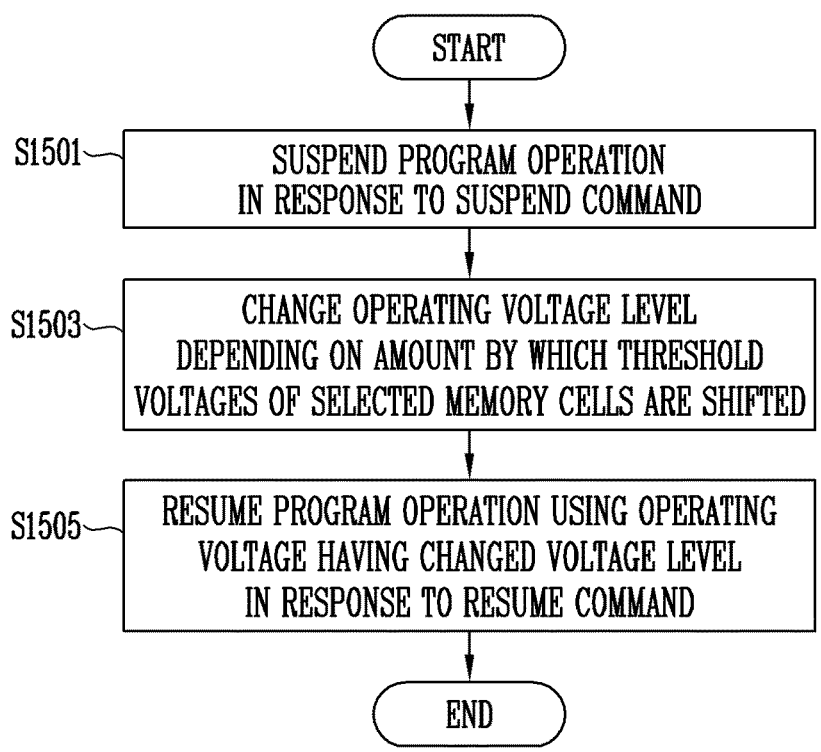
FIG. 15 is a diagram describing a method of determining a threshold voltage shift in accordance with an embodiment of the present invention disclosure.

FIG. 15 is a diagram for a method of operating the memory device in accordance with an embodiment of the present invention disclosure.

Referring to FIG. 15, at step S1501, in response to a suspend command, the memory device 100 may suspend a program operation that is being performed on selected memory cells. For example, as described with reference to FIGS. 4 to 11, the memory device 100 may receive the suspend command and suspend the program operation until a resume command is received. While the program operation is suspended, the memory device 100 may perform another operation. For example, the memory device 100 may perform a read operation while the program operation is suspended. Alternatively, the memory device 100 may perform an erase operation while the program operation is suspended. While the program operation is suspended, the threshold voltages of the selected memory cells may be shifted.

At step S1503, the memory device 100 may change the operating voltage level depending on the amount by which the threshold voltages of the selected memory cells are shifted while the program operation is suspended. For example, the memory device 100 may reduce the voltage level of a verify voltage to be applied to a selected word line after the program operation is resumed.

At step S1505, the memory device 100 may resume the program operation using the operating voltage having the changed voltage level in response to the received resume command. For example, the memory device 100 may resume the program operation using the verify voltage having the changed voltage level. As illustrated in FIGS. 9 and 11, compared to the case where the program operation using the verify voltage having the voltage level formed before being changed is completed, in the case where the program operation using the verify voltage having the changed voltage level is completed, the widths of the threshold voltage distributions may be reduced. Furthermore, a margin between the threshold voltage distributions may be increased.

Figure 16:
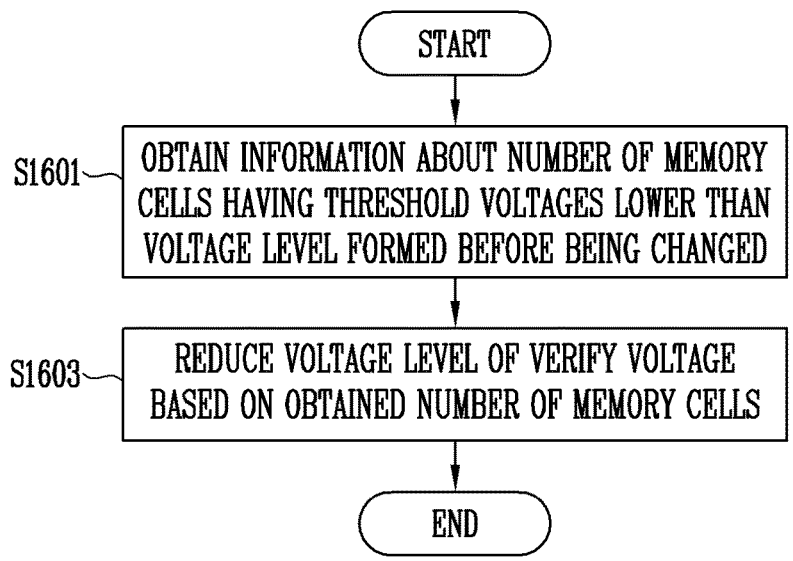
FIG. 16 is a diagram describing a method of reducing a verify voltage level in accordance with an embodiment of the present invention disclosure.

FIG. 16 is a diagram describing a method of determining the amount by which a threshold voltage is shifted in accordance with an embodiment.

FIG. 16 is a diagram illustrating an embodiment of step S1503 of FIG. 15. Referring to FIG. 16, at step S1601, the memory device 100 may obtain, in response to the resume command, information about the number of memory cells having a threshold voltage lower than the voltage level formed before being changed. For example, the memory device 100 may count the number of memory cells having threshold voltages lower than the voltage level formed before being changed among the selected memory cells. To count the number of memory cells, when the resume command is received, the memory device 100 may apply, to the selected word line, a verify voltage having the voltage level formed before being changed. When the verify voltage having the voltage level formed before being changed is applied to the selected word line, the memory device 100 may count the number of memory cells determined to be on-cells. For example, the memory device 100 may determine the amount by which the threshold voltages of the selected memory cells are shifted while the program operation using the verify voltage having the voltage level formed before being changed is suspended.

At step S1603, the memory device 100 may reduce the verify voltage level based on the counted number of memory cells. As the counted number of memory cells is increased, the memory device 100 may reduce the voltage level of the verify voltage to a lower value. Compared to the case where the program operation using the verify voltage having the voltage level formed before being changed is completed, in the case where the program operation using the verify voltage having the changed voltage level is completed, the widths of the threshold voltage distributions may be reduced. Furthermore, a margin between the threshold voltage distributions may be increased.

Figure 17:
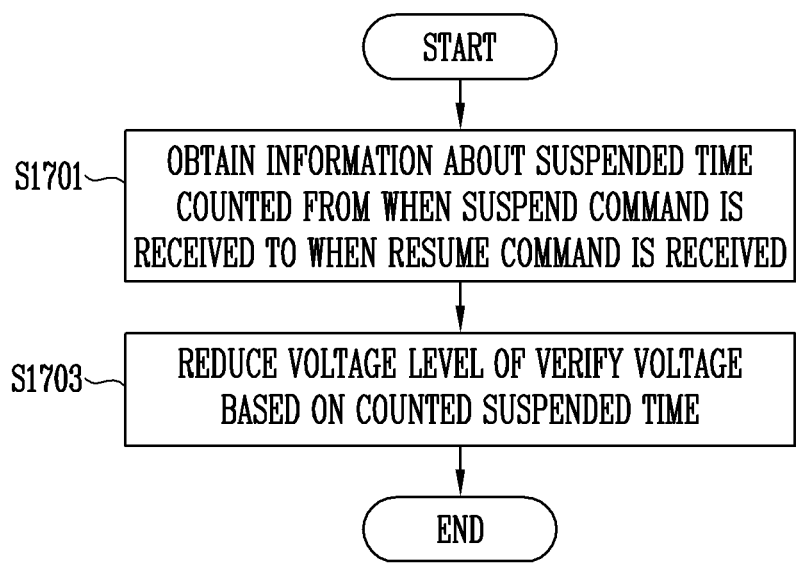
FIG. 17 is a diagram describing another method of reducing a verify voltage level in accordance with an embodiment of the present invention disclosure.

FIG. 17 is a diagram describing a method of determining the amount by which a threshold voltage is shifted in accordance with an embodiment.

FIG. 17 is a diagram illustrating an embodiment of step S1503 of FIG. 15. Referring to FIG. 17, at step S1701, in response to the resume command, the memory device 100 may obtain information about suspended time counted from when the suspend command is received to when the resume command is received. For example, the memory device 100 may count the number of edges of clock signals from when the suspend command is received to when the resume command is received. For example, the memory device may count a rising edge or a failing edge of a clock signal. For example, the memory device 100 may determine the amount by which the threshold voltages of the selected memory cells are shifted while the program operation is suspended, based on the time counted from when the suspend command is received to when the resume command is received.

At step S1703, the memory device 100 may reduce the verify voltage level based on the counted suspended time. As the counted suspended time is increased, the memory device 100 may reduce the voltage level of the verify voltage to a lower value. Compared to the case where the program operation using the verify voltage having the voltage level formed before being changed is completed, in the case where the program operation using the verify voltage having the changed voltage level is completed, the widths of the threshold voltage distributions may be reduced. Furthermore, a margin between the threshold voltage distributions may be increased.

Figure 18:
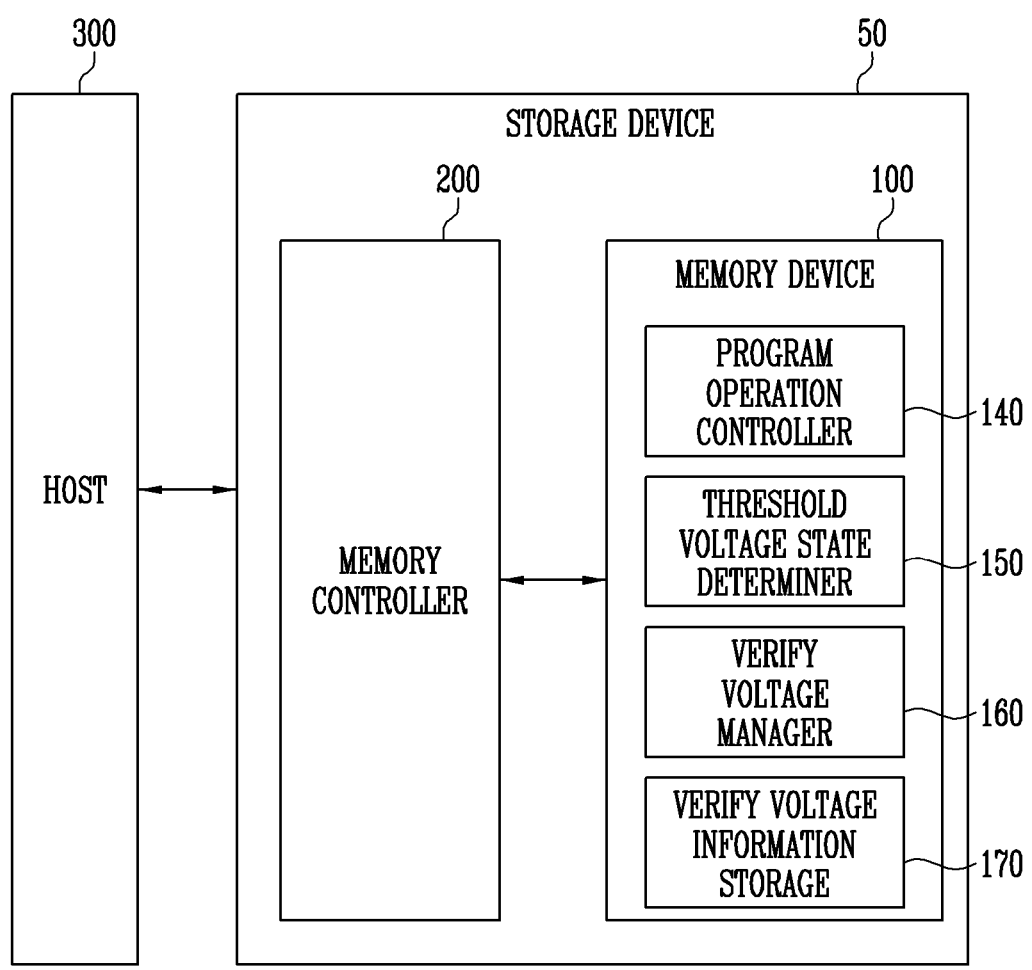
FIG. 18 is a block diagram illustrating a solid-state drive (SSD) system to which a storage device in accordance with an embodiment of the present invention disclosure is applied.

FIG. 18 is a diagram describing a storage device 50 in accordance with an embodiment of the present invention disclosure.

Referring to FIG. 18, the storage device 50 may include a memory device 100 and a memory controller 200 configured to control the operation of the memory device 100.

The storage device 50 may be a device configured to store data under control of a host 300 such as a cellular phone, a smartphone, an MP3 player, a laptop computer, a desktop computer, a game machine, a TV, a tablet PC, or an in-vehicle infotainment system.

The storage device 50 may be implemented as any one of various types of storage devices depending on a host interface, which is a communication system with the host 300. For example, the storage device 50 may be configured of any one of various types of storage devices such as an SSD, MMC, eMMC, RS-MMC, or micro-MMC type multimedia card, an SD, mini-SD, micro-SD type secure digital card, a universal serial bus (USB) storage device, a universal flash storage (UFS) device, a personal computer memory card international association (PCMCIA) card type storage device, a peripheral component interconnection (PCI) card type storage device, a PCI-express (PCI-E) type storage device, a compact flash (CF) card, a smart media card, and a memory stick.

The storage device 50 may be manufactured in the form of any one of various package types. For instance, the storage device 50 may be manufactured in the form of any one of various package types such as a package on package (POP) type, a system in package (SIP) type, a system on chip (SOC) type, a multi-chip package (MCP) type, a chip on board (COB) type, a wafer-level fabricated package (WFP) type, and a wafer-level stack package (WSP) type.

The memory device 100 may be the same as the memory device 100 described with reference to FIG. 1.

The memory device 100 may store data therein. The memory device 100 may operate under control of the memory controller 200. The memory device 100 may include a memory cell array 110 including a plurality of memory cells configured to store data.

The memory cells may include a single level cell (SLC) capable of storing a single data bit, a multi-level cell (MLC) capable of storing two data bits, a triple-level cell (TLC) capable of storing three data bits, or a quad-level cell (QLC) capable of storing four data bits.

The memory cell array 110 may include the plurality of memory cells. Each memory block may include a plurality of memory cells. Each memory block may include a plurality of pages. In an embodiment, each page may be the unit for storing data in the memory device 100 or reading stored data from the memory device 100. Each memory block may be the unit for erasing data.

In an embodiment, the memory device 100 may be a double data rate synchronous dynamic random-access memory (DDR SDRAM), a low power double data rate4 (LPDDR4) SDRAM, a graphics double data rate (GDDR) SDRAM, a low power DDR (LPDDR), a rambus dynamic random-access memory (RDRAM), a NAND flash memory, a vertical NAND flash memory, a NOR flash memory device, a resistive random-access memory (RRAM), a phase-change memory (PRAM), a magnetoresistive random-access memory (MRAM), a ferroelectric random-access memory (FRAM), or a spin transfer torque random-access memory (STT-RAM). In this specification, the memory device 100 is a NAND flash memory.

The memory device 100 may receive a command and an address from the memory controller 200. The memory device 100 may access an area of the memory cell array that is selected by the received address. Accessing the selected area may refer to performing an operation corresponding to the received command for the selected area. For example, the memory device 100 may perform a write (program) operation, a read operation, and an erase operation. During a program operation, the memory device 100 may program data to an area selected by an address. During a read operation, the memory device 100 may read data from an area selected by an address. During an erase operation, the memory device 100 may erase data from an area selected by an address.

In an embodiment, the memory device 100 may include the program operation controller 140, the threshold voltage state determiner 150, the verify voltage manager 160, and the verify voltage information storage 170 that have been described above with reference to FIG. 12.

The program operation controller 140 may control the peripheral circuit 120 to perform a write operation of programming data on selected memory cells. The program operation controller 140 may control the peripheral circuit 120 to perform a verify operation of verifying a write operation.

The threshold voltage state determiner 150 may determine the amount by which the threshold voltages of the selected memory cells are shifted while the program operation is suspended. In an embodiment, the threshold voltage state determiner 150 may determine the amount by which the threshold voltages of the selected memory cells are shifted, by performing the verify operation using a verify voltage having a voltage level formed before being changed and counting the number of memory cells determined to be on-cells. In an embodiment, the threshold voltage state determiner 150 may determine the amount by which the threshold voltages of the selected memory cells are shifted, by counting a suspended time from when the suspend command is received to when the resume command is received.

The verify voltage manager 160 may change the voltage level of the verify voltage depending on the amount by which the threshold voltages of the selected memory cells are shifted while the program operation is suspended. For example, the verify voltage manager 160 may load the information about the initial verify voltage stored in an area of the memory device 100 on the verify voltage information storage 170 when the memory device 100 boots. If the suspended program operation is resumed, the verify voltage manager 160 may generate information about the optimum verify voltage and store the information in the verify voltage information storage 170. For example, the verify voltage manager 160 may update the information about the initial verify voltage loaded on the verify voltage information storage 170 to the information about the optimum verify voltage.

When power is applied to the storage device 50, the memory controller 200 may execute firmware (FW). The firmware FW may include a host interface layer (HIL) configured to receive a request input from the host 300 or output a response to the host 300, a flash translation layer (FTL) configured to manage an operation between an interface of the host 300 and an interface of the memory device 100, and a flash interface layer (FIL) configured to provide a command to the memory device 100 or receive a response from the memory device 100.

The memory controller 200 may receive data and a logical address (LA) from the host 300, and translate the LA into a physical address (PA) indicating addresses of memory cells to which data is to be stored, the memory cells being included in the memory device 100. The logical address may be a logical block address (LBA). The physical address may be a physical block address (PBA).

The memory controller 200 may control the memory device 100 to perform a program operation, a read operation, or an erase operation in response to a request from the host 300. During the program operation, the memory controller 200 may provide a program command, a PBA, and data to the memory device 100. During the read operation, the memory controller 200 may provide a read command and a PBA to the memory device 100. During the erase operation, the memory controller 200 may provide an erase command and a PBA to the memory device 100.

The memory controller 200 may autonomously control the memory device 100 to perform a program operation, a read operation, or an erase operation regardless of a request from the host 300. For example, the memory controller 200 may control the memory device 100 to perform a program operation, a read operation, or an erase operation which is used to perform background operations such as a wear leveling operation, a garbage collection operation, and a read reclaim operation.

The host 300 may communicate with the storage device 50 using at least one of various communication methods such as universal serial bus (USB), serial AT attachment (SATA), serial attached SCSI (SAS), high speed interchip (HSIC), small computer system interface (SCSI), peripheral component interconnection (PCI), PCI express (PCIe), non-volatile memory express (NVMe), universal flash storage (UFS), secure digital (SD), multimedia card (MMC), embedded MMC (eMMC), dual in-line memory module (DIMM), registered DIMM (RDIMM), and load reduced DIMM (LRDIMM) communication methods.

Figure 19:
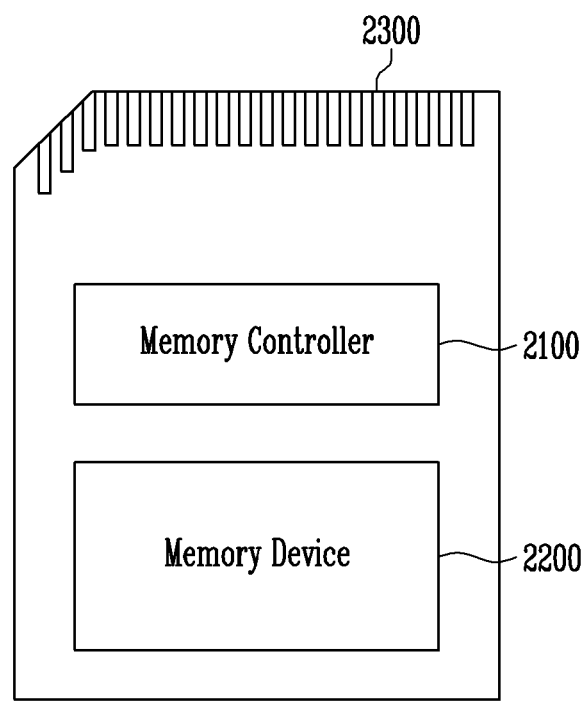
FIG. 19 is a block diagram illustrating a memory card system employing a storage device in accordance with an embodiment of the present invention disclosure.

FIG. 19 is a block diagram illustrating a memory card system 2000 to which a storage device in accordance with an embodiment of the present invention disclosure is applied.

Referring FIG. 19, the memory card system 2000 may include a memory controller 2100, a memory device 2200 and a connector 2300.

The memory controller 2100 is coupled to the memory device 2200. The memory controller 2100 may access the memory device 2200. For example, the memory controller 2100 may control a read operation, a write operation, an erase operation, and a background operation of the memory device 2200. The memory controller 2100 may provide an interface between the memory device 2200 and the host. The memory controller 2100 may drive firmware for controlling the memory device 2200.

In an embodiment, the memory controller 2100 may include components such as a random-access memory (RAM), a processing unit, a host interface, and a memory interface, and an ECC circuit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an electrically erasable and programmable ROM (EEPROM), a NAND flash memory, a NOR flash memory, a phase-change RAM (PCRAM), a resistive RAM (ReRAM), a ferroelectric RAM (FeRAM), and a spin transfer torque magnetic RAM (STT-MRAM).

In an embodiment, the memory controller 2100 and the memory device 2200 may be integrated into a single semiconductor device to form a memory card. For example, the memory controller 2100 and the memory device 2200 may be integrated into a single semiconductor device to form a memory card such as a personal computer memory card international association (PCMCIA), a compact flash card (CF), a smart media card (SM or SMC), a memory stick, a multimedia card (MMC, RS-MMC, or MMC micro), a SD card (SD, mini SD, micro SD, or SDHC), or a universal flash storage (UFS).

Figure 20:
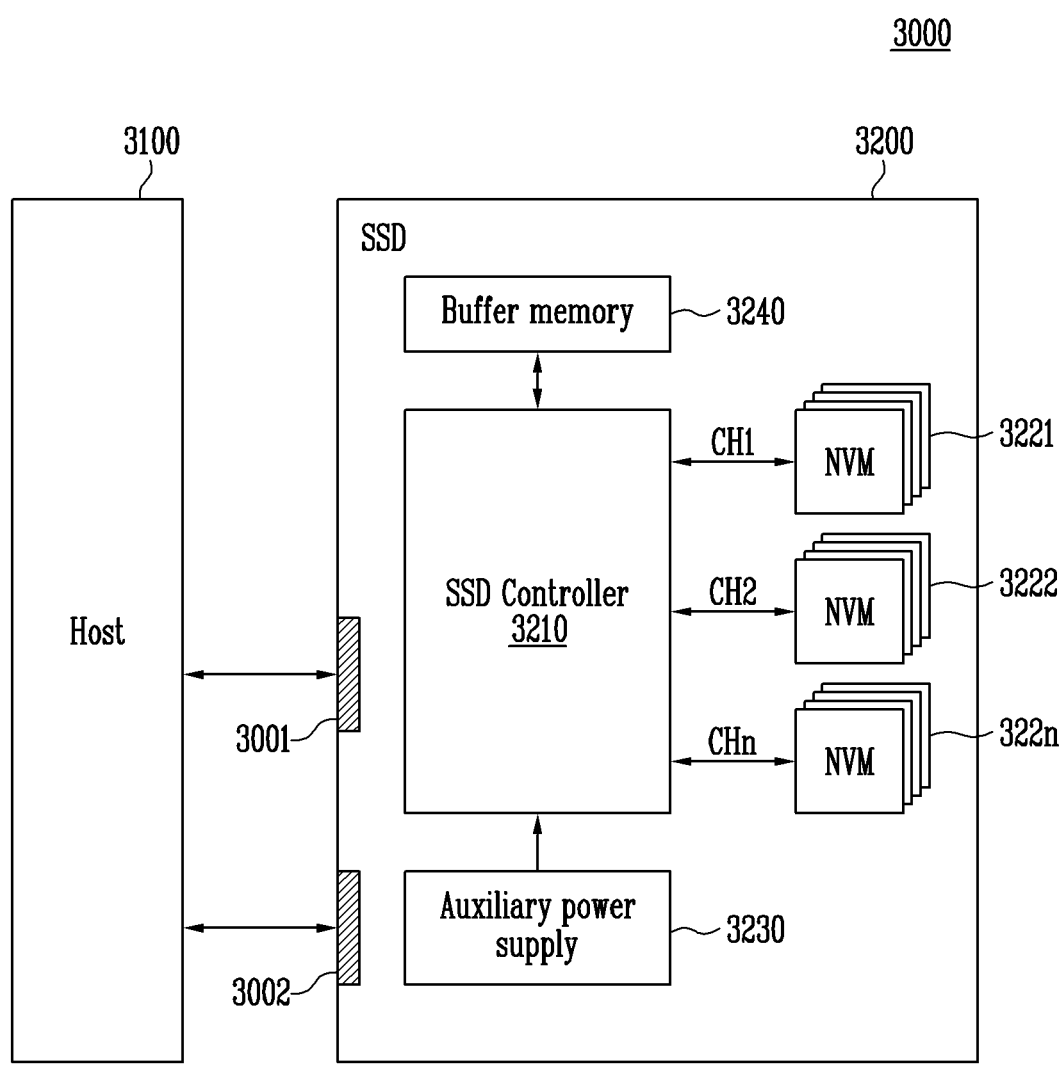
FIG. 20 is a block diagram illustrating a solid-state drive (SSD) system to which a storage device in accordance with an embodiment of the present invention disclosure is applied.

FIG. 20 is a block diagram illustrating a solid-state drive (SSD) system 3000 to which a storage device in accordance with an embodiment of the present invention disclosure is applied.

Referring to FIG. 20, the SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller 200, described above with reference to FIG. 18.

The SSD controller 3210 may control the plurality of flash memories 3221 to 322n in response to the signals SIG received from the host 3100. In an embodiment, the signals SIG may be signals based on an interface between the host 3100 and the SSD 3200. For example, the signals SIG may be signals defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100, and may be charged by the power PWR. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., a mapping table) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

Figure 21:
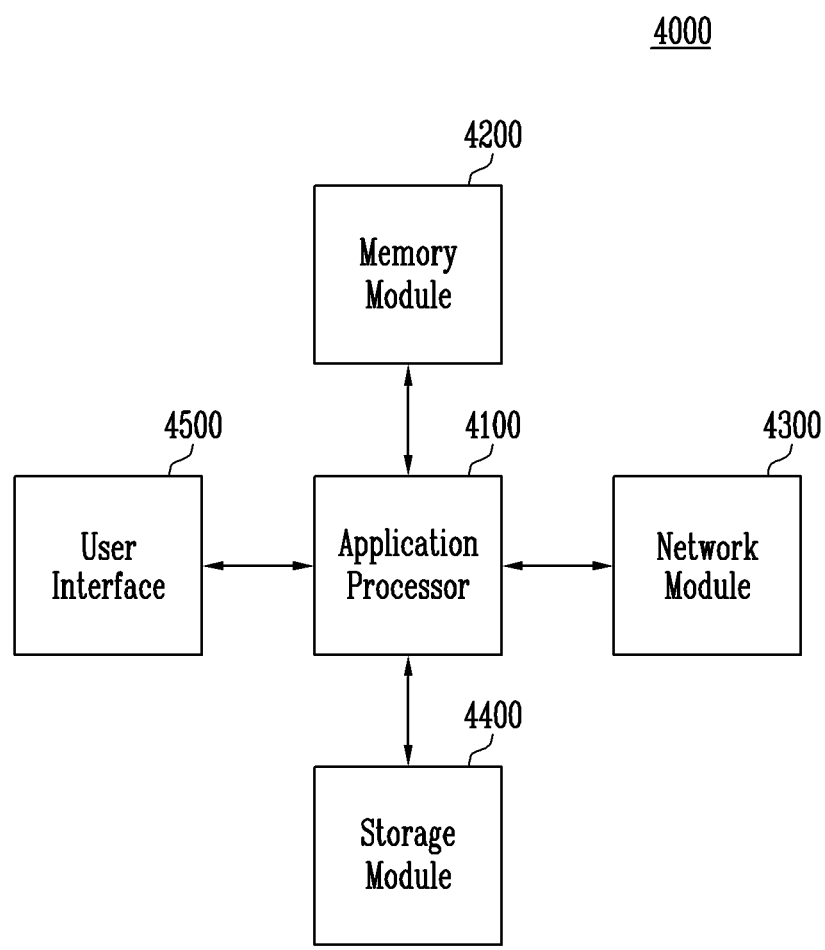
FIG. 21 is a block diagram illustrating a user system to which a storage device in accordance with an embodiment of the present invention disclosure is applied.

FIG. 21 is a block diagram illustrating a user system 4000 to which a storage device in accordance with an embodiment of the present invention disclosure is applied.

Referring to FIG. 21, the user system 4000 may include an application processor 4100, a memory module 4200, a network module 4300, a storage module 4400, and a user interface 4500.

The application processor 4100 may run components included in the user system 4000, an operating system (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory, or a cache memory of the user system 4000. The memory module 4200 may include a volatile RAM such as a DRAM, an SDRAM, a DDR SDRAM, a DDR2 SDRAM, a DDR3 SDRAM, an LPDDR SDARM, and an LPDDR3 SDRAM, or a nonvolatile RAM such as a PRAM, a ReRAM, an MRAM, and an FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as code division multiple access (CDMA), global system for mobile communication (GSM), wideband CDMA (WCDMA), CDMA-2000, time division multiple access (TDMA), long term evolution (LTE), WiMAX, WLAN, UWB, Bluetooth, or Wi-Fi communication. In an embodiment, the network module 4300 may be included in the application processor 4100.

The storage module 4400 may store data therein. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a phase-change RAM (PRAM), a magnetic RAM (MRAM), a resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

The storage module 4400 may be operated in the same manner as that of the storage device 50 described above with reference to FIG. 18.

The user interface 4500 may include interfaces for inputting data or instructions to the application processor 4100 or outputting data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a liquid crystal display (LCD), an organic light emitting diode (OLED) display device, an active matrix OLED (AMOLED) display device, an LED, a speaker, and the like.

Various embodiments of the present invention disclosure provide a memory device having program performance by which improved threshold voltage distributions can be formed, and a method of operating the memory device.

What is claimed is:

1. A memory device comprising:
   a plurality of memory cells;
   a peripheral circuit configured to verify a program operation on the plurality of memory cells using a first verify voltage; and
   a control logic configured to control the peripheral circuit to suspend the program operation in response to a suspend command and verify the program operation on the plurality of memory cells using a second verify voltage in response to a resume command input after the suspend command,
   wherein the second verify voltage has a lower voltage level than the first verify voltage, and
   wherein a voltage level of the second verify voltage is determined based on an amount by which threshold voltages of the plurality of memory cells are changed while the program operation is suspended.

2. The memory device according to claim 1, wherein the control logic comprises:
   a program operation controller configured to control the peripheral circuit to verify the program operation on the plurality of memory cells;
   a threshold voltage state determiner configured to generate shift information of the threshold voltages of the plurality of memory cells while the program operation is suspended; and
   a verify voltage manager configured to change the voltage level of the second verify voltage based on the shift information.

3. The memory device according to claim 2, further comprising a verify voltage information storage configured to store information about the first verify voltage or the second verify voltage,
   wherein the verify voltage manager stores the information about the first verify voltage in the verify voltage information storage at an initial stage, and updates the information about the first verify voltage to the information about the second verify voltage when the program operation is resumed.

4. The memory device according to claim 2, wherein the program operation controller controls the peripheral circuit to verify a program state using the first or second verify voltage.

5. The memory device according to claim 2, wherein the shift information includes information about a number of on-cells each of which is a memory cell having a threshold voltage lower than the voltage level of the first verify voltage.

6. The memory device according to claim 5, wherein the verify voltage manager comprises:
   a verify voltage change table storage configured to store a verify voltage change table indicating a relationship between a number of memory cells and a voltage level; and
   a verify voltage changer configured to obtain a voltage level of the second verify voltage corresponding to the number of on-cells with reference to the verify voltage change table.

7. The memory device according to claim 2, wherein the shift information includes information about a suspended time from when the suspend command is received to when the resume command is received.

8. The memory device according to claim 7, wherein the threshold voltage state determiner generates the information about the suspended time based on a clock signal counted from when the suspend command is received to when the resume command is received.

9. The memory device according to claim 8, wherein the verify voltage manager comprises:
   a verify voltage change table storage configured to store a verify voltage change table indicating a relationship between time and a voltage level; and a verify voltage changer configured to obtain a voltage level of the second verify voltage corresponding to the suspended time with reference to the verify voltage change table.

10. A memory device comprising:
a memory cell array including a plurality of memory cells;
a peripheral circuit configured to perform a program operation on the plurality of memory cells; and
a control logic configured to suspend the program operation in response to a suspend command and change, in response to a resume command input after the suspend command, at least one operating voltage to be used in the program operation depending on an amount by which threshold voltages of the plurality of memory cells are changed while the program operation is suspended.

11. The memory device according to claim 10, wherein the operating voltage includes a verify voltage used during an operation of verifying the program operation.

12. The memory device according to claim 11, wherein the control logic comprises:
a program operation controller configured to control the peripheral circuit to verify the program operation on the plurality of memory cells;
a threshold voltage state determiner configured to generate shift information indicating the amount by which the threshold voltages of the plurality of memory cells are shifted while the program operation is suspended; and
a verify voltage manager configured to change a voltage level of the verify voltage based on the shift information.

13. The memory device according to claim 12, wherein the shift information is information about a number of on-cells each of which is a memory cell having a threshold voltage lower than the voltage level of the verify voltage before being changed.

14. The memory device according to claim 12, wherein the shift information is information about a suspended time from when the suspend command is received to when the resume command is received.

15. A method of operating a memory device including a plurality of memory cells, the method comprising:
suspending a program operation on the plurality of memory cells in response to a suspend command;
changing a voltage level of a verify voltage to be used in an operation of verifying the program operation based on shift information indicating a degree by which threshold voltages of the plurality of memory cells are shifted while the program operation is suspended; and
resuming the program operation using a verify voltage having a changed voltage level in response to a resume command.

16. The method according to claim 15, wherein the changing of the voltage level of the verify voltage comprises:
obtaining, in response to the resume command, information about a number of on-cells each of which is a memory cell having a threshold voltage lower than the voltage level formed before the changing; and
reducing the voltage level of the verify voltage based on the number of on-cells.

17. The method according to claim 16, wherein reducing the voltage level of the verify voltage comprises:
obtaining a voltage level corresponding to the number of on-cells with reference to a verify voltage change table indicating a relationship between a number of memory cells and a voltage level; and
changing the voltage level of the verify voltage to the obtained voltage level.

18. The method according to claim 15, wherein the changing of the voltage level of the verify voltage comprises:
obtaining information about a suspended time from when the suspend command is received to when the resume command is received; and
reducing the voltage level of the verify voltage based on the suspended time.

19. The method according to claim 18, wherein the obtaining of the information about the suspended time comprises generating information about the suspended time based on a clock signal counted from when the suspend command is received to when the resume command is received.

20. The method according to claim 19, wherein the reducing of the voltage level of the verify voltage comprises:
obtaining a voltage level corresponding to the suspended time with reference to a verify voltage change table indicating a relationship between time and voltage levels; and
changing the voltage level of the verify voltage to the obtained voltage level.

* * * * *